(12) United States Patent
Castillo et al.

(10) Patent No.: US 11,485,677 B2
(45) Date of Patent: Nov. 1, 2022

(54) TEXTURED GLASS ARTICLES AND METHODS OF MAKING THE SAME

(71) Applicant: Corning Incorporated, Corning, NY (US)

(72) Inventors: Gilbert Alexander Castillo, Corning, NY (US); Melanie Lian Geiger, Horseheads, NY (US); Yuhui Jin, Painted Post, NY (US); Aize Li, Painted Post, NY (US); Ying Zhang, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 126 days.

(21) Appl. No.: 16/912,601

(22) Filed: Jun. 25, 2020

(65) Prior Publication Data
US 2020/0407270 A1 Dec. 31, 2020

Related U.S. Application Data

(60) Provisional application No. 62/868,307, filed on Jun. 28, 2019.

(51) Int. Cl.
| | | |
|---|---|---|
| *B32B 3/00* | (2006.01) | |
| *C03C 15/00* | (2006.01) | |
| *H05K 5/00* | (2006.01) | |
| *H05K 5/02* | (2006.01) | |
| *H05K 5/03* | (2006.01) | |

(52) U.S. Cl.
CPC .......... *C03C 15/00* (2013.01); *H05K 5/0017* (2013.01); *H05K 5/0217* (2013.01); *H05K 5/03* (2013.01)

(58) Field of Classification Search
CPC ..................................................... C03C 15/00
See application file for complete search history.

(56) References Cited

U.S. PATENT DOCUMENTS

| | | | |
|---|---|---|---|
| 5,659,007 A | 8/1997 | Akiyoshi et al. | |
| 9,411,180 B2 | 8/2016 | Gollier et al. | |
| 2018/0282201 A1* | 10/2018 | Hancock, Jr | ............ C03C 3/083 |
| 2019/0243052 A1* | 8/2019 | Hamilton | ............ G02B 6/0068 |
| 2020/0095160 A1 | 3/2020 | Jin et al. | |

(Continued)

FOREIGN PATENT DOCUMENTS

| | | |
|---|---|---|
| CN | 102786839 A | 11/2012 |
| CN | 103979803 A | 8/2014 |

(Continued)

OTHER PUBLICATIONS

Chiu; "Development of screen-printed texture-barrier paste for single-side texturization of interdigitated back-contact silicon solar cell applications"; MATERIALS 6 (10) 2013; 4565-4573.

(Continued)

*Primary Examiner* — Elizabeth E Mulvaney
(74) *Attorney, Agent, or Firm* — William Tucker

(57) ABSTRACT

A method is described herein of making a textured glass article where the method includes: providing a glass substrate having an initial primary surface and an opposing primary surface; disposing a protective coating on at least one of the initial primary surface or the opposing primary surface; and etching the glass substrate with a hydrofluoric acid-free etchant having a pH of about 7 or less to form a leached layer in the glass substrate.

21 Claims, 9 Drawing Sheets

(56) References Cited

U.S. PATENT DOCUMENTS

2020/0325064 A1  10/2020  Amin et al.
2020/0377409 A1  12/2020  Jin et al.

FOREIGN PATENT DOCUMENTS

| CN | 105330996 A | 2/2016 |
| CN | 105347691 A | 2/2016 |
| CN | 105348804 A | 2/2016 |
| CN | 105670382 A | 6/2016 |
| CN | 107417871 A | 12/2017 |
| GB | 2292110 A | 2/1996 |
| JP | 3486655 B2 | 1/2004 |
| JP | 2008-100073 A | 5/2008 |
| KR | 10-2009-0018713 A | 2/2009 |
| WO | 2011/034898 A1 | 3/2011 |
| WO | 2011/137144 A1 | 4/2011 |
| WO | 2013/189762 A1 | 12/2013 |
| WO | 2018/182996 A1 | 10/2018 |
| WO | 2019/055745 A1 | 3/2019 |

OTHER PUBLICATIONS

Invitation to Pay Additional Fees of the International Searching Authority; PCT/US2020/039723; dated Nov. 5, 2020; 11 Pages; European Patent Office.
Luangtriratana "UV-polymerisable, phosphorus-containing, flame-retardant surface coatings for glass fibre-reinforced epoxy composites"; Progress in Organic Coatings, vol. 78, 2015, 73-82.
U.S. Appl. No. 17/015,668; by Jaymin Amin et al., titled "Textured, Antiglare Glass Articles and Methods of Making the Same", filed Sep. 9, 2020.

\* cited by examiner

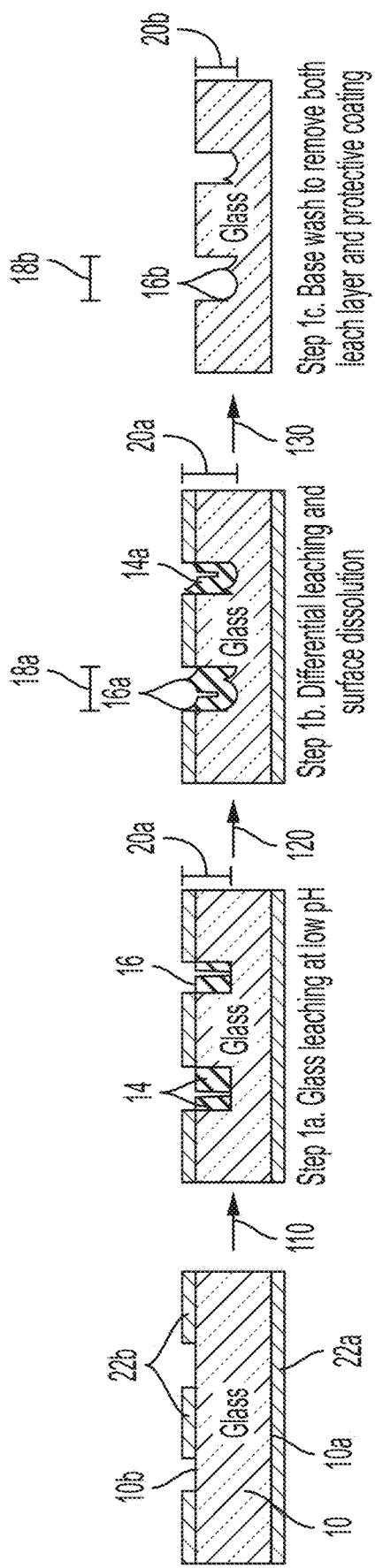
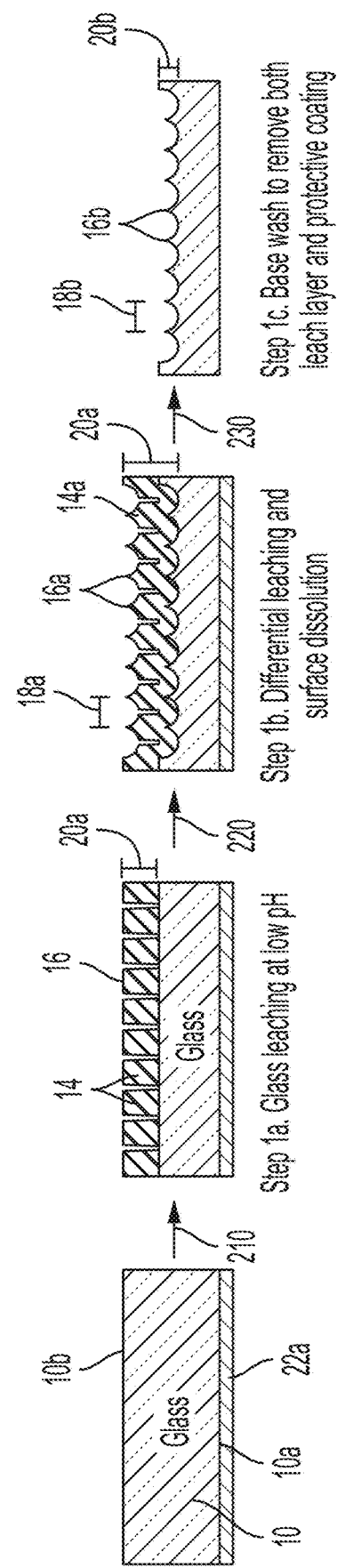
FIG. 3A
FIG. 3B

US 11,485,677 B2

TEXTURED GLASS ARTICLES AND METHODS OF MAKING THE SAME

CLAIM OF PRIORITY

This application claims the benefit of priority under 35 U.S.C. § 119 of U.S. Provisional Application No. 62/868,307, filed on Jun. 28, 2019, the contents of which are incorporated herein by reference in its entirety.

FIELD

The present disclosure generally relates to textured glass articles and methods of making the same, particularly hydrofluoric acid-free methods to produce substantially transparent, low sparkle, textured glass articles.

BACKGROUND

Antiglare surfaces are often used in display devices such as LCD screens, OLEDs and touch screens to avoid or reduce specular reflection of ambient light. In many display devices, these antiglare surfaces are formed by providing a level of roughness to one or more surfaces of the glass to spread and scatter incident light. Antiglare surfaces in the form a roughened glass surface are often used on the front surfaces of these display devices to reduce the apparent visibility of external reflections from the display and improve readability of the display under differing lighting conditions. These roughened surfaces are also employed in some display device applications, particularly touch screens, to improve tactile feeling.

Display "sparkle" or "dazzle" is a phenomenon that can occur when antiglare or light scattering surfaces are incorporated into a display system. Sparkle is associated with a very fine grainy appearance that can appear to have a shift in the pattern of the grains with changing viewing angle of the display. This type of sparkle is observed when pixelated displays, such as LCDs, are viewed through an antiglare surface. As the resolution of display devices continues to increase, particularly for handheld electronic devices, the pixel pitch of the array of pixels employed in these devices continues to decrease, exacerbating unwanted sparkle effects.

Conventional approaches to making textured glass surfaces suffer from the use of treatments that employ aggressive acids, such as hydrofluoric acid, that are not considered environmentally friendly and costly to employ in manufacturing. Still further, conventional approaches to texturing glass for roughened antiglare surfaces result in relatively large features which can limit the effectiveness of these surfaces in minimizing sparkle. Further, other conventional approaches to creating antiglare surfaces employ additional coatings which can increase manufacturing cost and produce unwanted optical effects.

In view of these considerations, there is a need for textured glass articles with smaller features and methods of making the same, particularly hydrofluoric acid-free methods to produce substantially transparent, low sparkle, textured glass articles.

SUMMARY

In some embodiments, a method of making a textured glass article, comprises: providing a glass substrate having an initial primary surface and an opposing primary surface; disposing a protective coating on at least one of the initial primary surface or the opposing primary surface; and etching the glass substrate with a hydrofluoric acid-free etchant having a pH of about 7 or less to form a leached layer in the glass substrate.

In one aspect, which is combinable with any of the other aspects or embodiments, the step of disposing comprises: depositing a patterned protective coating on the initial primary surface.

In one aspect, which is combinable with any of the other aspects or embodiments, the step of disposing further comprises: depositing a blanket protective coating on the opposing primary surface.

In one aspect, which is combinable with any of the other aspects or embodiments, the protective coating comprises: a blend of an adhesion promoting component and a heat and/or acid resistant shielding component.

In one aspect, which is combinable with any of the other aspects or embodiments, the adhesion promoting component comprises at least one of: acryloyloxyalkyl silanes, alkyl silanes, aminoalkyl silanes, aryl silanes, arylalkyl silanes, fluoroalkyl silanes, fluoroaryl silanes, glycidyloxyalkyl silanes, olefinyl silanes, or combinations thereof.

In one aspect, which is combinable with any of the other aspects or embodiments, the acryloyloxyalkyl silanes are selected from the group consisting of: 3-(trimethoxysilyl)propyl acrylate, 3-(chlorodimethylsilyl)propyl methacrylate, 3-[diethoxy(methyl)silyl]propyl methacrylate, 3-[dimethoxy(methyl)silyl]propyl acrylate, 3-(trimethoxysilyl)propyl methacrylate, 3-[tris(trimethylsilyloxy)silyl]propyl methacrylate, 3-[dimethoxy(methyl)silyl]propyl methacrylate, 3-(methoxydimethylsilyl)propyl acrylate, 3-(triethoxysilyl)propyl methacrylate, 3-(triallylsilyl)propyl acrylate, 3-(triallylsilyl)propyl methacrylate, (triethoxysilyl)methyl methacrylate; the alkyl silanes are selected from the group consisting of: amyltrichlorosilane, butyltrichlorosilane, tert-butyldimethylchlorosilane [tert-butyldimethylsilylating Agent], butylchlorodimethylsilane, 1,2-bis(triethoxysilyl)ethane, butyltriethoxysilane, 1,6-bis(trichlorosilyl)hexane, 1,6-bis(triethoxysilyl)hexane, chlorotrimethylsilane, cyclohexyltrichlorosilane, chloro(decyl)dimethylsilane, chloro(dodecyl)dimethylsilane, cyclohexyltrimethoxysilane, chloro(hexyl)dimethylsilane, cyclopentyltrimethoxysilane, chlorocyclohexyldimethylsilane, chloro(ethyl)dimethylsilane [dimethylethylsilylating Agent], decyltrichlorosilane, dodecyltrichlorosilane, dodecyltriethoxysilane, dimethyloctadecylchlorosilane, chlorodimethylpropylsilane [dimethylpropylsilylating Agent], dimethylisopropylchlorosilane [dimethylisopropylsilylating Agent], dimethyl-n-octylchlorosilane, chlorodiethylisopropylsilane, dodecyltrimethoxysilane, decyltriethoxysilane, dichloro(methyl)propylsilane, dimethoxy(methyl)-n-octylsilane, ethyltrichlorosilane, triethoxyethylsilane, ethyltrimethoxysilane, trichlorohexylsilane, hexyltrimethoxysilane, hexyltriethoxysilane, hexadecyltrimethoxysilane, 1,1,1,3,5,5,5-heptamethyl-3-[(trimethylsilyl)oxy]trisiloxane, hexadecyltriethoxysilane, isobutyltrichlorosilane, trichloro(methyl)silane, triethoxymethylsilane, trimethoxy(methyl)silane, methoxy(dimethyl)octadecylsilane, trichlorooctadecylsilane, octadecyltriethoxysilane, n-octyltrichlorosilane, triethoxy-n-octylsilane, octadecyltrimethoxysilane, trichloro(propyl)silane, chlorotriethylsilane, triisopropylsilyl chloride, trimethoxy(propyl)silane, chloro(dimethyl)thexylsilane, thexyltrichlorosilane, triethoxy(propyl)silane, trimethoxy-n-octylsilane, trichloro(hexadecyl)silane, triethoxy(isobutyl)silane, trichlorooctadecylsilane; the aminoalkyl silanes are selected from the group consisting of: 3-aminopropyltriethoxysilane, 3-(2-aminoethylamino)propyltrimethoxysilane, 3-(2-aminoethylamino)propyldimethoxymethylsilane, 3-(2-aminoethylamino)propyltriethoxysilane, 3-aminopropyldimethoxymethylsilane, [3-(6-aminohexylamino)propyl]trimethoxysilane, bis[3-(trimethoxysilyl)propyl]amine, 3-aminopropyldiethoxymethylsilane, [3-(N,N-dimethylamino)propyl]trimethoxysilane, trimethoxy[3-(phenylamino)propyl]silane, 3-aminopropyltrimethoxysilane, trimethyl[3-(triethoxysilyl)propyl]ammonium chloride, trimethyl[3-(trimethoxysilyl)propyl]ammonium chloride (ca. 50% in Methanol), trimethoxy[3-(methylamino)propyl]silane, N-[3-(trimethoxysilyl)propyl]butan-1-amine; the aryl silanes and arylalkyl silanes are selected from the group consisting of: benzylchlorodimethylsilane, benzyltriethoxysilane, chlorodimethyl(3-phenylpropyl)silane, chlorodimethylphenylsilane, dimethoxymethylphenylsilane, diethoxy(methyl)phenylsilane, dichloro(methyl)(2-phenylethyl)silane; the fluoroalkyl silanes and fluoroaryl silanes are selected from the group consisting of: chlorodimethyl(3,3,4,4,5,5,6,6,7,7,8,8,8-tridecafluoro-n-octyl)silane, chlorodimethyl[3-(2,3,4,5,6-pentafluorophenyl)propyl]silane, chloro(3,3,4,4,5,5,6,6,7,7,8,8,9,9,10,10,10-heptadecafluorodecyl)dimethylsilane, dichloro(methyl)(3,3,3-trifluoropropyl)silane, dimethoxy(methyl)(3,3,3-trifluoropropyl)silane, pentafluorophenyldimethylchlorosilane [pentafluorophenyldimethylsilylating Agent], pentafluorophenylethoxydimethylsilane, triethoxy-1H,1H,2H,2H-tridecafluoro-n-octylsilane, trichloro(1H,1H,2H,2H-tridecafluoro-n-octyl)silane, trichloro(1H,1H,2H,2H-heptadecafluorodecyl)silane, trimethoxy(3,3,3-trifluoropropyl)silane, triethoxy(1H,1H,2H,2H-nonafluorohexyl)silane, triethoxy-1H,1H,2H,2H-heptadecafluorodecylsilane, trimethoxy(1H,1H,2H,2H-heptadecafluorodecyl)silane, trimethoxy(1H,1H,2H,2H-nonafluorohexyl)silane, trichloro[3-(pentafluorophenyl)propyl]silane, triethoxy(pentafluorophenyl)silane, triethoxy[5,5,6,6,7,7,7-heptafluoro-4,4-bis(trifluoromethyl)heptyl]silane, trimethoxy(pentafluorophenyl)silane, trichloro(3,3,3-trifluoropropyl)silane, trimethoxy(1H,1H,2H,2H-tridecafluoro-n-octyl)silane; the glycidyloxyalkyl silanes are selected from the group consisting of: diethoxy(3-glycidyloxypropyl)methylsilane, 3-glycidyloxypropyltrimethoxysilane, 3-glycidyloxypropyl(dimethoxy)methylsilane, [8-(glycidyloxy)-n-octyl]trimethoxysilane, triethoxy(3-glycidyloxypropyl)silane; and the olefinyl silanes are selected from the group consisting of: allyltriethoxysilane, allylchlorodimethylsilane, allyltrimethoxysilane, [bicyclo[2.2.1]hept-5-en-2-yl]triethoxysilane (mixture of isomers), chlorodimethylvinylsilane, diethoxymethylvinylsilane, dimethoxymethylvinylsilane, 1,1,1,5,5,5-hexamethyl-3-[(trimethylsilyl)oxy]-3-vinyltrisiloxane, trichlorovinylsilane, triisopropoxy(vinyl)silane, vinyltrimethoxysilane, triethoxyvinylsilane, dimethylethoxyvinylsilane, vinyltris(2-methoxyethoxy)silane, etc.), (11-azidoundecyl)trimethoxysilane, (bromomethyl)chlorodimethylsilane, (11-bromoundecyl)trichlorosilane, chloro(chloromethyl)dimethylsilane, 3-trimethoxysilylpropyl chloride, 3-chloropropyltrichlorosilane, 3-chloropropyldimethoxymethylsilane, (3-cyanopropyl)dimethylchlorosilane, 2-cyanoethyltriethoxysilane, (chloromethyl)triethoxysilane, (chloromethyl)trimethoxysilane, (3-chloropropyl)diethoxy(methyl)silane, chloro(3-chloropropyl)dimethylsilane, 2-(3,4-epoxycyclohexyl)ethyltrimethoxysilane, tris[3-(trimethoxysilyl)propyl] isocyanurate, (3-iodopropyl)trimethoxysilane, (3-mercaptopropyl)trimethoxysilane, 3-mercaptopropyl(dimethoxy)methylsilane, (3-mercaptopropyl)triethoxysilane, 2-propynyl [3-(Triethoxysilyl)propyl]carbamate, 3-chloropropyltriethoxysilane, 1-[3-(trimethoxysilyl)propyl]urea, (3-isocyanatopropyl)trimethoxysilane, [(3-triethoxysilyl)propyl]succinic anhydride, 3-(trichlorosilyl)propyl 2-bromo-2-methylpropanoate, 3-(trimethoxysilyl)propyl 2-bromo-2-methylpropanoate, 3-(triethoxysilyl)propyl 2-bromo-2-methylpropanoate, 1-[3-(triethoxysilyl)propyl]urea, N-[2-(N-vinylbenzylamino)ethyl]-3-aminopropyltrimethoxysilane hydrochloride, trimethylsiloxysilicate.

In one aspect, which is combinable with any of the other aspects or embodiments, the heat and/or acid resistant shielding component comprises at least one of: polystyrene (PS), polyethylene (PE), polypropylene (PP), polyvinyl chloride (PVC), polyamide, polytetrafluoroethylene, thermoplastic polyurethanes (TPU), polychlorotrifluoroethylene (PCTFE), phenol-formaldehyde resin, para-aramids, polyethylene terephthalate, polychloroprene, meta-aramid polymers, polyacrylonitrile (PAN), co-polyamids, polyimides, aromatic polyesters, poly-p-phenylene-2,6-benzobisoxazole (PBO), copolymers of ethylene and chlorotrifluoroethylene (ECTFE), polyvinylidene fluoride (PVDF), chlorinated polyvinyl chloride (CPVC), polydicyclopentadiene (PDCPD), poly(1,3,4-oxadiazole), polyquinoxalines, polyquinolines, hexafluoroisopropylidene (HFIP)-containing polymers, hexafluoroisopropoxy (HFIP-O) group-containing polymers, cellulose acetate, cellulose acetate butyrate, or monomers thereof.

In one aspect, which is combinable with any of the other aspects or embodiments, the step of disposing comprises: dissolving an adhesion promoting component and a heat and/or acid resistant shielding component in an organic solvent to form a blend; disposing the blend on the at least one of the initial primary surface or the opposing primary surface via at least one of: spin coating, spray coating, screen printing, inkjet printing, slot die coating, draw-down coating, or dip coating to form the protective coating; and curing the protective coating by solvent evaporation, thermal curing, or irradiation.

In one aspect, which is combinable with any of the other aspects or embodiments, the step of etching comprises: etching the glass substrate with an etchant comprising at least one of hydrochloric acid (HCl), citric acid, iron (III) chloride hexahydrate, hydrofluoric acid (HF), acetic acid, sulfuric acid ($H_2SO_4$), or nitric acid ($HNO_3$) at a temperature in a range of 40° C. to 120° C. for a time in a range of 30 min to 3 hrs.

In one aspect, which is combinable with any of the other aspects or embodiments, the step of etching further comprises: removing excess etchant and leached substrate constituents.

In one aspect, which is combinable with any of the other aspects or embodiments, the step of etching comprises: a first etching step to form an interim textured glass substrate having a first leached layer with a plateaued top surface; and a second etching step to form a secondary textured glass substrate having a second leached layer with a plurality of exposed features, wherein the plurality of exposed features have a first average feature size and a first average roughness.

In one aspect, which is combinable with any of the other aspects or embodiments, the plurality of exposed features comprise a plurality of peaks and valleys; the first average feature size is a distance between adjacent peaks in a range of less than about 10 µm; and the first average roughness is a peak-to-valley distance in a range of 1 nm to 1000 nm.

In one aspect, which is combinable with any of the other aspects or embodiments, the method further comprises: removing the protective coating and the second leached layer to form the textured glass article having a second average feature size and a second average roughness, wherein the second average feature size and the second average roughness is substantially equivalent to the first average feature size and the first average roughness.

In one aspect, which is combinable with any of the other aspects or embodiments, the method further comprises: removing the protective coating and the leached layer to form the textured glass article having an average feature size and an average roughness.

In one aspect, which is combinable with any of the other aspects or embodiments, the textured glass article comprises a sparkle of 2% or less.

In some embodiments, a method of making a textured glass article, comprises: providing a glass substrate having an initial primary surface and an opposing primary surface; disposing a protective coating on at least one of the initial primary surface or the opposing primary surface; a first etching step to form an interim textured glass substrate having a first leached layer with a plateaued top surface; and a second etching step to form a secondary textured glass substrate having a second leached layer with a plurality of exposed features, wherein the plurality of exposed features have a first average feature size and a first average roughness.

In one aspect, which is combinable with any of the other aspects or embodiments, the plurality of exposed features comprise a plurality of peaks and valleys; the first average feature size is a distance between adjacent peaks in a range of less than about 10 μm; and the first average roughness is a peak-to-valley distance in a range of 1 nm to 1000 nm.

In one aspect, which is combinable with any of the other aspects or embodiments, the method further comprises: removing the protective coating and the second leached layer to form the textured glass article having a second average feature size and a second average roughness, wherein the second average feature size and the second average roughness is substantially equivalent to the first average feature size and the first average roughness.

In one aspect, which is combinable with any of the other aspects or embodiments, a consumer electronic product, comprises: a housing having a front surface, a back surface and side surfaces; electrical components provided at least partially within the housing, the electrical components including at least a controller, a memory, and a display, the display being provided at or adjacent the front surface of the housing; and a cover glass disposed over the display, wherein at least one of a portion of the housing or the cover glass is formed by the methods described herein.

Additional features and advantages will be set forth in the detailed description which follows and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary and are intended to provide an overview or framework to understanding the nature and character of the disclosure as it is claimed.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following aspects.

BRIEF DESCRIPTION OF THE DRAWINGS

These and other features, aspects and advantages of the present disclosure are better understood when the following detailed description of the disclosure is read with reference to the accompanying drawings, in which:

FIGS. 3A and 3B are schematic, flow charts depicting methods of making textured glass articles using double-coated (FIG. 3A) and single-coated (FIG. 3B) glass substrates, according to some embodiments.

DETAILED DESCRIPTION

Figure 1A:
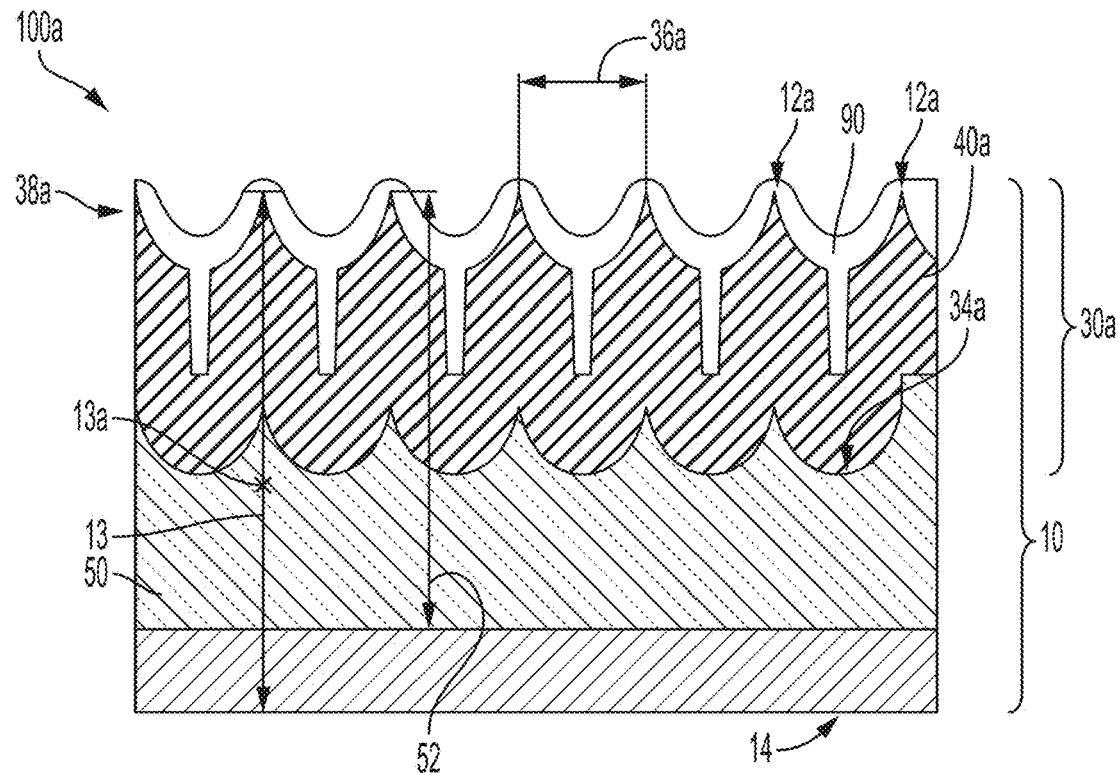
FIGS. 1A and 1B are cross-sectional, schematic views of textured glass articles comprising: a textured region with a textured region composition comprising a higher amount of silica than silica in the bulk composition (FIG. 1A) and a textured region with a textured region composition comprising a substantially equivalent amount of silica as contained in the bulk composition (FIG. 1), according to some embodiments.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

In some implementations, roughness may be broadly defined as half of a peak-to-valley distance.

Aspects of the disclosure generally pertain to textured glass articles and, particularly, transparent textured glass articles with low sparkle. Aspects of the disclosure include methods of making these articles, particularly with hydrofluoric acid-free processes. More generally, the approaches to preparing the textured glass articles of the disclosure generate finely textured surfaces with features of less than 5 microns on multi-component glass substrates with compositions that comprise appreciable amounts of silica and one or more additional components. In general, the heterogeneous nature of the glass substrate allows it to be selectively etched with one or more hydrofluoric acid-free etchants, leaving a porous silica-rich layer that can serve as the textured region for the textured glass article. Additional process steps can be employed to remove the porous-silica rich layer, leaving a textured surface with a composition comparable to the bulk composition of the substrate for the textured glass article.

Referring to FIG. 1A, a textured glass article 100a is depicted as including a glass substrate 10 with a plurality of primary surfaces 12a and 14, a thickness 13 and a bulk composition at about the midpoint 13a of the thickness 13. In some embodiments, the bulk composition comprises about 40 mol % to 80 mol % silica. The glass article 100a also includes a textured region 30a with a composition having at least 40 mol % silica. In some embodiments, the textured region 30a is formed from or otherwise part of the substrate 10, as shown in FIG. 1A. In such implementations, the textured region 30a is defined between the primary surface 12a and a textured region interface 34a within the substrate 10. In other implementations (not shown), the textured region 30a is present over the substrate 10, with the interface 34a residing between the textured region 30a and the substrate 10.

As generally depicted in FIG. 1A, the textured region 30a includes a plurality of exposed features on its primary surface 12a with an average feature size 36a and an average roughness 38a. According to some implementations of the textured glass article 100a, the exposed features of the textured region 30a, including their average feature size 36a and average roughness 38a, are configured to reduce the level of glare associated with article when it is employed in a display device. The average feature size 36a is given by an average of the maximum dimension of a sampling of features associated with the textured region 30a, measured according to analytical techniques as understood by those with ordinary skill in the field of this disclosure, for example, by taking an image of primary surface 12a with an atomic force microscope at 200× magnification and measuring the maximum dimension of a sampling of at least ten (10) features. Accordingly, the terms "average feature size" and "average maximum dimension" are used interchangeably in the disclosure. In some embodiments, at least some of the plurality of features have a peak and a valley. The "maximum dimension" of the exposed features is the greatest distance from one portion of a peak of a feature to another portion of the peak of the feature. In embodiments, the average feature size 36a associated with the textured region 30a of the article 100a is less than about 10 microns. According to some implementations, the average feature size 36a associated with the textured region 30a is less than about 5 microns, less than about 1 micron, or less than about 0.5 microns in some cases. Further, the average feature size 36a can be less than about 10 microns, 9 microns, 8 microns, 7 microns, 6 microns, 5 microns, 4 microns, 3 microns, 2 microns, 1 micron, 0.9 microns, 0.8 microns, 0.7 microns, 0.6 microns, 0.5 microns, 0.4 microns, 0.3 microns, 0.2 microns, 0.1 microns, and all values between these upper limits.

Referring again to the textured region 30a associated with the textured glass article 100a depicted in FIG. 1A, the average roughness 38a can be measured as surface roughness, $R_a$, using an interferometer and a sample area of 200 microns by 200 microns. The interferometer used was a ZYGO© NEWVIEW™ 7300 Optical Surface Profiler manufactured by ZYGO© Corporation. The surface roughness is reported as a mean surface roughness. In embodiments, the glass article 100a can employ a textured region 30a having an average roughness 38a from about 10 nanometers to about 500 nanometers ($R_a$). According to some implementations, the average roughness 38a associated with the textured region 30a is from about 10 nanometers to about 500 nanometers ($R_a$), from about 20 nanometers to about 400 nanometers ($R_a$), from about 30 nanometers to about 300 nanometers ($R_a$), and all values between these levels of surface roughness. Further, in some implementations of the textured glass article 100a, the textured region 30a possesses an average roughness 38a from about 0.1 nanometers to about 300 nanometers ($R_a$), and all values between these levels of surface roughness.

When a textured region of a glass article has a relatively low spatial frequency, the roughness associated with its exposed features can begin to act like a plurality of lenses that generates an image artifact called "sparkle." Display "sparkle" or "dazzle" is a generally undesirable side effect that can occur when introducing antiglare or light scattering surfaces into a pixelated display system such as, for example, a LCD, an OLED, touch screens, or the like, and differs in type and origin from the type of "sparkle" or "speckle" that has been observed and characterized in projection or laser systems. Sparkle is associated with a very fine grainy appearance of the display and may appear to have a shift in the pattern of the grains with changing viewing angle of the display. Display sparkle may be manifested as bright and dark or colored spots at approximately the pixel-level size scale.

As used herein, the terms "pixel power deviation" and "PPD" refer to the quantitative measurement for display sparkle. Further, as used herein, the term "sparkle" is used interchangeably with "pixel power deviation" and "PPD." PPD is calculated by image analysis of display pixels according to the following procedure. A grid box is drawn around each LCD pixel. The total power within each grid box is then calculated from CCD camera data and assigned as the total power for each pixel. The total power for each LCD pixel thus becomes an array of numbers, for which the mean and standard deviation may be calculated. The PPD value is defined as the standard deviation of total power per pixel divided by the mean power per pixel (times 100). The total power collected from each LCD pixel by the eye simulator camera is measured and the standard deviation of total pixel power (PPD) is calculated across the measurement area, which typically comprises about 30×30 LCD pixels.

The details of a measurement system and image processing calculation that are used to obtain PPD values are described in U.S. Pat. No. 9,411,180 entitled "Apparatus and Method for Determining Sparkle," the contents of which that is related to PPD measurements is incorporated by reference herein in its entirety. The PPD measurement system includes: a pixelated source comprising a plurality of pixels, wherein each of the plurality of pixels has referenced indices i and j; and an imaging system optically disposed along an optical path originating from the pixelated source. The imaging system comprises: an imaging device disposed along the optical path and having a pixelated sensitive area comprising a second plurality of pixels, wherein each of the second plurality of pixels are referenced with indices m and n; and a diaphragm disposed on the optical path between the pixelated source and the imaging device, wherein the diaphragm has an adjustable collection angle for an image originating in the pixelated source. The image processing calculation includes: acquiring a pixelated image of the transparent sample, the pixelated image comprising a plurality of pixels; determining boundaries between adjacent pixels in the pixelated image; integrating within the boundaries to obtain an integrated energy for each source pixel in the pixelated image; and calculating a standard deviation of the integrated energy for each source pixel, wherein the standard deviation is the power per pixel dispersion. As used herein, all "PPD" and "sparkle" values, attributes and limits are calculated and evaluated with a test setup employing a display device having a pixel density of 210 pixels per inch (PPI).

As generally depicted in FIG. 1A, the textured region 30a of the textured glass article 100a can be configured to minimize sparkle. In some embodiments, the textured region 30a is configured to minimize sparkle, while maintaining a reduced glare function suitable for display device applications. According to some embodiments, the textured region 30a of the textured glass article 100a is configured such that the article is characterized by a sparkle of 2% or less. In other aspects, the textured glass articles 100a of the disclosure can be configured with a sparkle of 2% or less, 1.5% or less, 1% or less, 0.5% or less, and all sparkle levels between these upper limits.

Referring again to FIG. 1A, the glass substrate 10 of the textured glass article 100a is configured with a multi-component glass composition having about 40 mol % to 80 mol % silica and a balance of one or more other constituents, e.g., alumina, calcium oxide, sodium oxide, boron oxide, etc. In some implementations, the bulk composition of the glass substrate 10 is selected from the group consisting of aluminosilicate glass, a borosilicate glass and a phosphosilicate glass. In other implementations, the bulk composition of the glass substrate 10 is selected from the group consisting of aluminosilicate glass, a borosilicate glass, a phosphosilicate glass, a soda lime glass, an alkali aluminosilicate glass, and an alkali aluminoborosilicate glass. In further implementations, the glass substrate 10 is a glass-based substrate, including but not limited to, glass-ceramic materials that comprise a glass component at about 90% or greater by weight and a ceramic component.

In one embodiment of the textured glass article 100a, the glass substrate 10 has a bulk composition that comprises an alkali aluminosilicate glass that comprises alumina, at least one alkali metal and, in some embodiments, greater than 50 mol %, $SiO_2$, in other embodiments, at least 58 mol %, and in still other embodiments, at least 60 mol % $SiO_2$, wherein the ratio ($Al_2O_3$ (mol %)+$B_2O_3$ (mol %))/$\Sigma$ alkali metal modifiers (mol %)>1, where the modifiers are alkali metal oxides. This glass, in particular embodiments, comprises, consists essentially of, or consists of: about 58 mol % to about 72 mol % $SiO_2$; about 9 mol % to about 17 mol % $Al_2O_3$; about 2 mol % to about 12 mol % $B_2O_3$; about 8 mol % to about 16 mol % $Na_2O$; and 0 mol % to about 4 mol % $K_2O$, wherein the ratio ($Al_2O_3$ (mol %)+$B_2O_3$ (mol %))/$\Sigma$ alkali metal modifiers (mol %)>1, where the modifiers are alkali metal oxides.

In another embodiment of the textured glass article 100a, as shown in FIG. 1A, the glass substrate 10 has a bulk composition that comprises an alkali aluminosilicate glass comprising, consisting essentially of, or consisting of: about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % $MgO$; and 0 mol % to about 3 mol % $CaO$.

In yet another embodiment, the glass substrate 10 has a bulk composition that comprises an alkali aluminosilicate glass comprising, consisting essentially of, or consisting of: about 60 mol % to about 70 mol % $SiO_2$; about 6 mol % to about 14 mol % $Al_2O_3$; 0 mol % to about 15 mol % $B_2O_3$; 0 mol % to about 15 mol % $Li_2O$; 0 mol % to about 20 mol % $Na_2O$; 0 mol % to about 10 mol % $K_2O$; 0 mol % to about 8 mol % $MgO$; 0 mol % to about 10 mol % $CaO$; 0 mol % to about 5 mol % $ZrO_2$; 0 mol % to about 1 mol % $SnO_2$; 0 mol % to about 1 mol % $CeO_2$; less than about 50 ppm $As_2O_3$; and less than about 50 ppm $Sb_2O_3$; wherein 12 mol %≤$Li_2O$+$Na_2O$+$K_2O$≤20 mol % and 0 mol %≤$MgO$+$Ca$≤10 mol %.

In still another embodiment, the glass substrate 10 has a bulk composition that comprises an alkali aluminosilicate glass comprising, consisting essentially of, or consisting of: about 64 mol % to about 68 mol % $SiO_2$; about 12 mol % to about 16 mol % $Na_2O$; about 8 mol % to about 12 mol %

Al$_2$O$_3$; 0 mol % to about 3 mol % B$_2$O$_3$; about 2 mol % to about 5 mol % K$_2$O; about 4 mol % to about 6 mol % MgO; and 0 mol % to about 5 mol % CaO, wherein: 66 mol %≤SiO$_2$+B$_2$O$_3$+CaO≤69 mol %; Na$_2$O+K$_2$O+B$_2$O$_3$+MgO+CaO+SrO>10 mol %; 5 mol %≤MgO+CaO+SrO≤8 mol %; (Na$_2$O+B$_2$O$_3$)—Al$_2$O$_3$≤2 mol %; 2 mol %≤Na$_2$O—Al$_2$O$_3$≤6 mol %; and 4 mol % (Na$_2$O+K$_2$O)—Al$_2$O$_3$ 10 mol %.

In other embodiments, the glass substrate 10 has a bulk composition that comprises SiO$_2$, Al$_2$O$_3$, P$_2$O$_5$, and at least one alkali metal oxide (R$_2$O), wherein 0.75>[(P$_2$O$_5$ (mol %)+R$_2$O (mol %))/M$_2$O$_3$ (mol %)]≤1.2, where M$_2$O$_3$=Al$_2$O$_3$+B$_2$O$_3$. In some embodiments, [(P$_2$O$_5$ (mol %)+R$_2$O (mol %))/M$_2$O$_3$ (mol %)]=1 and, in some embodiments, the glass does not include B$_2$O$_3$ and M$_2$O$_3$=Al$_2$O$_3$. The glass substrate comprises, in some embodiments: about 40 to about 70 mol % SiO$_2$; 0 to about 28 mol % B$_2$O$_3$; about 0 to about 28 mol % Al$_2$O$_3$; about 1 to about 14 mol % P$_2$O$_5$; and about 12 to about 16 mol % R$_2$O. In some embodiments, the glass substrate comprises: about 40 to about 64 mol % SiO$_2$; 0 to about 8 mol % B$_2$O$_3$; about 16 to about 28 mol % Al$_2$O$_3$; about 2 to about 12 mol % P$_2$O$_5$; and about 12 to about 16 mol % R$_2$O. The glass substrate 10 may further comprise at least one alkaline earth metal oxide such as, but not limited to, MgO or CaO.

In some embodiments, the glass substrate 10 has a bulk composition that is substantially free of lithium; i.e. the glass comprises less than 1 mol % Li$_2$O and, in other embodiments, less than 0.1 mol % Li$_2$O and, in other embodiments, 0.01 mol % Li$_2$O, and in still other embodiments, 0 mol % Li$_2$O. In some embodiments, such glasses are free of at least one of arsenic, antimony, and barium; i.e. the glass comprises less than 1 mol % and, in other embodiments, less than 0.1 mol %, and in still other embodiments 0 mol % of As$_2$O$_3$, Sb$_2$O$_3$, and/or BaO.

In other embodiments of the textured glass article 100a, the glass substrate 10 has a bulk composition that comprises, consists essentially of or consists of a glass composition Corning® Eagle XG® glass, Corning® Gorilla® glass, Corning® Gorilla® Glass 2, Corning® Gorilla® Glass 3, Corning® Gorilla® Glass 4 or Corning® Gorilla® Glass 5.

As also depicted in FIG. 1A, the textured region 30a of the textured glass article 100a can be defined by a porous leached layer 40a that ranges between the primary surface 12a and the textured region interface 34a of the glass substrate 10. In some embodiments, the porous leached layer 40a comprises a higher amount of silica than the silica content in the bulk composition of the glass substrate 10. As an example for purposes of illustration, a textured glass article 100a with a glass substrate 10 possessing a bulk composition comprising about 50 mol % silica may include a textured region 30a with a porous leached layer 40a possessing about 70 mol % silica. As will be outlined in greater detail below, the porous leached layer 40a can be created through a low pH treatment of the glass substrate 10. Such a treatment can preferentially remove non-silica components of the substrate 10, thus leaving a porous leached layer 40a with a higher silica content than the bulk composition of the substrate 10.

Figure 1B:
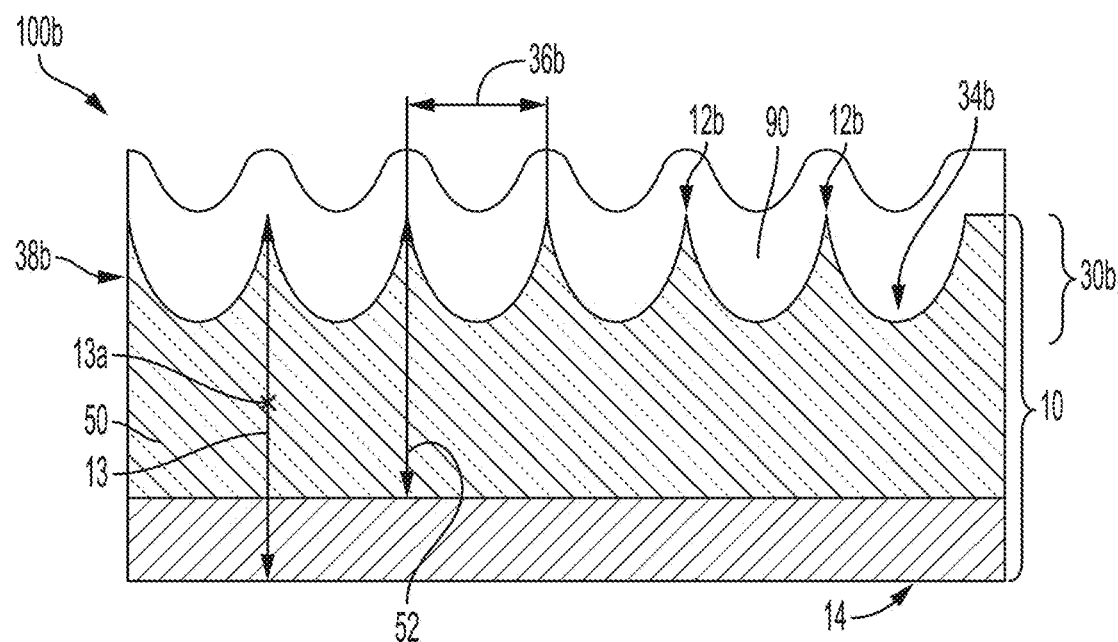

Referring now to FIG. 1B, a textured glass article 100b is depicted as including a glass substrate 10 with a plurality of primary surfaces 12b and 14, a thickness 13 and a bulk composition at the midpoint 13a of the thickness 13. In some embodiments, the bulk composition comprises about 40 mol % to 80 mol % silica. It should be understood that the textured glass article 100b is substantially similar to the textured glass article 100a with regard to function and attributes. Further, unless otherwise noted, like-numbered elements associated with textured glass article 100b depicted in FIG. 1B have the same or equivalent structure and function as the same elements associated with the textured glass article 100a depicted in FIG. 1A and outlined earlier. The primary difference between textured glass articles 100a and 100b is that the textured region 30a of the textured glass article 100a can include a porous leached layer 40a, as shown in FIG. 1A, and the textured region 30b of the textured glass article 100b is not characterized with a porous leached layer comparable to the layer 40a.

Turning back to FIG. 1B, the textured glass article 100b includes a textured region 30b with a composition having at least 40 mol % silica. The textured region 30b is defined by the primary surface 12b and the textured region interface 34b of the glass substrate 10. As depicted in exemplary fashion in FIG. 1B, the textured region interface 34b of the textured region 30b is substantially coincident with the primary surface 12b of the glass substrate 10, as indicative of a textured region 30b having little to no depth within the substrate 10. In other aspects, the primary surface 12b of the substrate 10 resides above the textured region interface 34b, as indicative of a textured region 30b having a depth within the substrate 10, e.g., as defined from the primary surface 12b to a depth given by the textured region interface 34b (not shown).

As generally depicted in FIG. 1B, the textured region 30b includes a plurality of exposed features on its primary surface 12b with an average feature size 36b and an average roughness 38b. According to some implementations of the textured glass article 100b, the exposed features of the textured region 30b, including their average feature size 36b and average roughness 38b, are configured to reduce the level of glare associated with the article when it is employed in a display device. The average feature size 36b is given by an average of the maximum dimension of a sampling of features associated with the textured region 30b, measured according to analytical techniques as understood by those with ordinary skill in the field of this disclosure, for example, by taking a photomicrograph of primary surface 12a at 200× magnification and measuring the maximum dimension of a sampling of at least ten (10) features. In embodiments, the average feature size 36b associated with the textured region 30b of the article 100b is less than about 10 microns. According to some implementations, the average feature size 36b associated with the textured region 30b is less than about 5 microns, less than about 1 micron, or less than about 0.5 microns in some cases. Further, the average feature size 36b can be less than about 10 microns, 9 microns, 8 microns, 7 microns, 6 microns, 5 microns, 4 microns, 3 microns, 2 microns, 1 micron, 0.9 microns, 0.8 microns, 0.7 microns, 0.6 microns, 0.5 microns, 0.4 microns, 0.3 microns, 0.2 microns, 0.1 microns, and all values between these upper limits.

Referring again to the textured region 30b associated with the textured glass article 100b depicted in FIG. 1B, the average roughness 38b can be measured as surface roughness, R$_a$, using the technique described above with reference to FIG. 1A. In embodiments, the glass article 100b can employ a textured region 30b having an average roughness 38b from about 10 nanometers to about 500 nanometers (R$_a$). According to some implementations, the average roughness 38b associated with the textured region 30b is from about 10 nanometers to about 500 nanometers (R$_a$), from about 20 nanometers to about 400 nanometers (R$_a$), from about 30 nanometers to about 300 nanometers (R$_a$), and all values between these levels of surface roughness.

Further, in some implementations of the textured glass article 100*b*, the textured region 30*b* possesses an average roughness 38*b* from about 0.1 nanometers to about 300 nanometers ($R_a$), and all values between these levels of surface roughness.

According to some embodiments of the textured glass article 100*b* depicted in FIG. 1B, the textured region 30*b* can be characterized such that its composition is substantially equivalent to the bulk composition of the glass substrate 10, particularly with regard to silica content. As will be outlined in greater detail below, the textured region 30*b* can be created through successive low pH and high pH treatments to the glass substrate 10. The low pH treatment can preferentially remove non-silica components of the substrate 10, leaving a porous leached layer 40*a* with a higher silica content than the bulk composition of the substrate 10. The subsequent high pH treatment, however, can be configured to remove the porous leached layer, leaving a textured region 30*b* having about the same composition as the bulk composition of the glass substrate 10, particularly with regard to silica content.

As used herein, the terms "transmission haze" and "haze" refer to the percentage of transmitted light scattered outside an angular cone of about 2.5° in accordance with ASTM procedure D1003, entitled "Standard Test Method for Haze and Luminous Transmittance of Transparent Plastics," the contents of which is incorporated by reference herein in its entirety. For an optically smooth surface, transmission haze is generally close to zero. According to implementations of the textured glass articles 100*a*, 100*b* (see FIGS. 1A & 1B), the articles can be characterized by a haze of 25% or less. In other implementations, for particular applications, textured glass articles 100*a*, 100*b* consistent with the principles of this disclosure can be fabricated with haze levels as high as 100%, haze levels ranging from 0% to 100%, haze levels from 0% to 50%, and all haze levels between these values. For example, desired haze levels in the textured glass articles 100*a*, 100*b* can be obtained by controlling the etching conditions associated with producing the respective textured regions 30*a*, 30*b*. In general, higher acid concentrations and/or etching times can increase the amount of haze associated with a particular textured glass article 100*a*, 100*b*.

According to other embodiments, the glass substrate 10 of the textured glass articles 100*a*, 100*b* (see FIGS. 1A & 1B) can possess an ion-exchangeable glass composition that is strengthened by either chemical or thermal means that are known in the art. In one embodiment, the glass substrate is chemically strengthened by ion exchange. In this process, metal ions at or near a primary surface 12*a*, 12*b* of the glass substrate 10 (see FIGS. 1A & 1B) are exchanged for larger metal ions having the same valence as the metal ions in the glass substrate. The exchange is generally carried out by contacting the glass substrate 10 with an ion exchange medium such as, for example, a molten salt bath that contains the larger metal ion. The metal ions are typically monovalent metal ions such as, for example, alkali metal ions. In one non-limiting example, chemical strengthening of a glass substrate 10 that contains sodium ions by ion exchange is accomplished by immersing the glass substrate 10 in an ion exchange bath comprising a molten potassium salt such as potassium nitrate ($KNO_3$) or the like. In one particular embodiment, the ions in the surface layer of the glass substrate 10 and the larger ions are monovalent alkali metal cations, such as $Li^+$ (when present in the glass), $Na^+$, $K^+$, $Rb^+$, and $Cs^+$. Alternatively, monovalent cations in the surface layer of the glass substrate 10 may be replaced with monovalent cations other than alkali metal cations, such as $Ag^+$ or the like.

In these embodiments, the replacement of small metal ions by larger metal ions in the ion exchange process creates a compressive stress region 50 in the glass substrate 10 that extends from the primary surface 12*a*, 12*b* to a depth 52 (see FIGS. 1A & 1B) (referred to as the "depth of layer") that is under compressive stress. This compressive stress at the primary surface of the glass substrate is balanced by a tensile stress (also referred to as "central tension") within the interior of the glass substrate. In some embodiments, the primary surface 12*a* or 12*b* of the glass substrate 10 described herein, when strengthened by ion exchange, has a compressive stress of at least 350 MPa, and the region under compressive stress extends to a depth 52, i.e., depth of layer, of at least 15 m below the primary surface 12*a* or 12*b*.

Ion exchange processes are typically carried out by immersing the glass substrate 10 in a molten salt bath containing the larger ions to be exchanged with the smaller ions in the glass. It will be appreciated by those skilled in the art that parameters for the ion exchange process, including, but not limited to, bath composition and temperature, immersion time, the number of immersions of the glass in a salt bath (or baths), use of multiple salt baths, additional steps such as annealing, washing, and the like, are generally determined by the composition of the glass and the desired depth of layer and compressive stress of the glass as a result of the strengthening operation. By way of example, ion exchange of alkali metal-containing glasses may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 16 hours. However, temperatures and immersion times different from those described above may also be used. Such ion exchange treatments, when employed with a glass substrate 10 having an alkali aluminosilicate glass composition, result in a compressive stress region 50 having a depth 52 (depth of layer) ranging from about 10 μm up to at least 50 μm with a compressive stress ranging from about 200 MPa up to about 800 MPa, and a central tension of less than about 100 MPa.

As the etching and leaching processes that can be employed to create the textured regions 30*a*, 30*b*, according to some embodiments, can, in some instances, remove alkali metal ions from the glass substrate 10 that would otherwise be replaced by a larger alkali metal ion during an ion exchange process, a preference exists for developing a compressive stress region 50 in the textured glass article 100*a*, 100*b* after the formation and development of the textured region 30*a*, 30*b*. In other embodiments, a compressive stress region 50 can be developed in the glass substrate 10 prior to development of the textured region 30*a*, 30*b* to a depth 52 sufficient to account for some loss in the depth of layer in the region 50 associated with the low pH, or low and high pH treatments, as outlined below.

According to another implementation of the textured glass articles 100*a*, 100*b* depicted in FIGS. 1A and 1, the article further includes an easy-to-clean (ETC) coating 90 disposed over the textured region 30*a*, 30*b*. In most embodiments, the ETC coating 90 is deposited over the textured region 30*a*, 30*b* such that its surface morphology generally mirrors the underlying morphology of the textured region 30*a*, 30*b*. In one embodiment, the textured glass article 100*a*, 100*b* further includes a smudge-resistant fluorine-based ETC coating 90, deposited on at least a portion of the textured region 30a, 30b. In embodiments, the ETC coating 90 comprises at least one amphiphobic substance having fluorine termination groups provide the textured region 30a, 30b with amphiphobicity (i.e., hydrophobicity and oleophobicity, or lack of affinity for both oils and water), thus minimizing wetting of the surface by water and/or oils. The fluorine termination groups of the ETC coating 90 are less polar than a surface having —OH termination groups, and therefore minimize hydrogen (i.e., Van der Waals) bonding between particles and liquids. For fingerprint oils and debris associated with fingerprints, bonding—and adhesion—is minimized. Consequently, mass transport of oils and debris from the finger to the ETC coating 90 is minimized. In one embodiment, the ETC coating 90 is formed by exchanging the hydrogen found in terminal OH groups on the textured region 30a, 30b of the textured glass article 100a, 100b with a fluorine-based moiety such as, for example, a fluorine-containing monomer (e.g., a fluorosilane), to form a glass having terminal fluorinated groups.

In another embodiment, the ETC coating 90 of the textured glass articles 100a, 100b comprises a self-assembled monolayer of a fluorine-terminating molecular chain. In yet another embodiment, the ETC coating 90 comprises a thin, fluoro-polymeric coating and, in yet another embodiment, the ETC coating comprises silica soot particles that have been treated to have pendent fluorocarbon groups attached to the soot particles. Such ETC coatings 90 can be applied to the textured region 30a, 30b of the textured glass article 100a, 100b by dipping, vapor coating, spraying, application with a roller, or other suitable method known in the art. After the ETC coating 90 has been applied, it may be "cured" at temperatures ranging from about 25° C. up to about 150° C. and, in another embodiment, at temperatures ranging from about 40° C. up to about 100° C. Curing times can range from about 1 up to about 4 hours and may be carried out in an atmosphere containing 40-95% moisture. After curing, the textured glass articles 100a, 100b with an ETC coating 90 can be solvent rinsed to remove any unbound coating and air-dried prior to use.

Figure 2A:
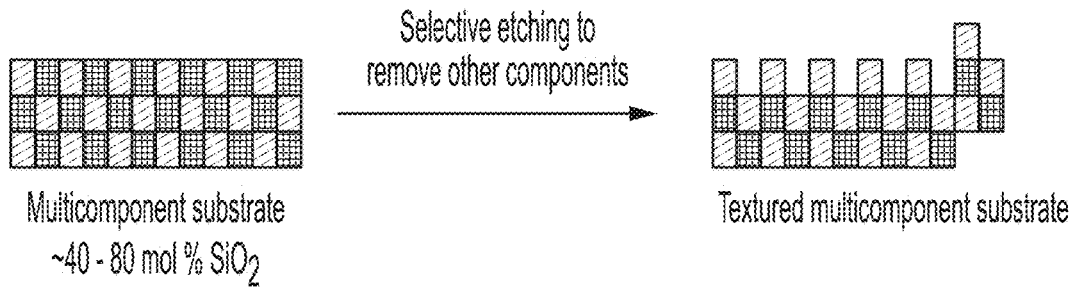
FIGS. 2A to 2C are schematic charts illustrating the effects of leaching a silica-containing, multicomponent glass substrate with about 40-80 mol % of silica (FIG. 2A), less than 40 mol % of silica (FIG. 2B), and greater than 80 mol % of silica (FIG. 2C), according to some embodiments.
Figure 2B:
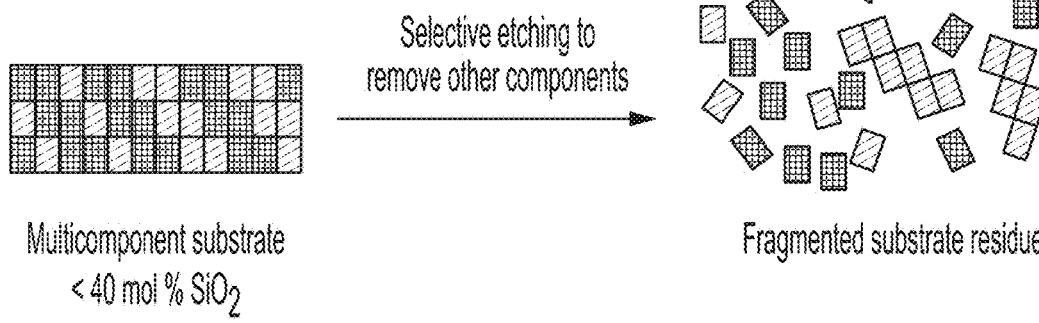
Figure 2C:
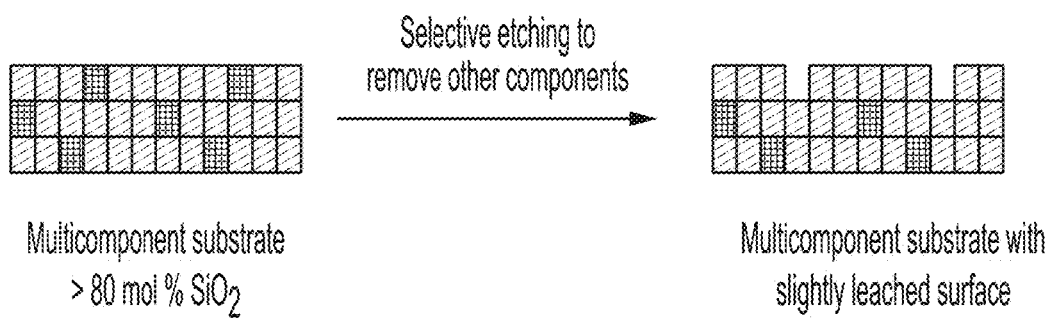

Referring now to FIGS. 2A to 2C, schematic charts illustrate the effects of employing a low pH leaching process according to the disclosure to a silica-containing, multicomponent glass substrate (e.g., a glass substrate comparable to glass substrate 10) with varying levels of silica. In FIG. 2A, a glass substrate with a composition having about 40 mol % to about 80 mol % silica is subjected to a low pH leaching process and non-silica components (denoted as "other components" in FIGS. 2A to 2C) are removed. The net result is a textured glass article (e.g., as comparable to a textured glass article 100a depicted in FIG. 1A) with a textured region having a higher silica content than the bulk composition of the substrate. In contrast, the FIGS. 2B and 2C represent the effects of conducting the same low pH process with glass substrate compositions outside the preferred window in terms of silica content. That is, the substrate in FIG. 2B has a silica content of less than 40 mol %, and this substrate essentially falls apart or significantly degrades from the removal of the non-silica components during the low pH treatment. On the other hand, the substrate in FIG. 2C has a silica content of greater than 80 mol %, and the surface of this substrate is nearly indistinguishable from the surface of the substrate prior to etching; consequently, the substrate in FIG. 2C does not possess a textured region consistent with the principles of the disclosure after being subjected to the low pH treatment.

FIGS. 3A and 3B are schematic, flow charts depicting methods of making textured glass articles using double-coated (FIG. 3A) and single-coated (FIG. 3B) glass substrates, according to some embodiments.

As shown, a glass substrate 10 (curved or flat) is provided with an initial primary surface 10b upon which a patterned protective coating 22b may be deposited (as in FIG. 3A), and an opposing primary surface 10a upon which a blanket protective coating 22a is disposed.

In some examples, the protective coating may be a blend of an adhesion promoting component (to aide in adhesion to the glass substrate) and a heat and/or acid resistant shielding component (e.g., substrate-adhesion promoting component-heat and/or acid resistant shielding component).

For example, the adhesion promoter is selected to promote adhesion between the substrate and the heat and/or acid resistant shielding component and comprises at least one of: (1) acryloyloxyalkyl silanes (e.g., 3-(trimethoxysilyl)propyl acrylate, 3-(chlorodimethylsilyl)propyl methacrylate, 3-[diethoxy(methyl)silyl]propyl methacrylate, 3-[dimethoxy(methyl)silyl]propyl acrylate, 3-(trimethoxysilyl)propyl methacrylate, 3-[tris(trimethylsilyloxy)silyl]propyl methacrylate, 3-[dimethoxy(methyl)silyl]propyl methacrylate, 3-(methoxydimethylsilyl)propylacrylate, 3-(triethoxysilyl)propylmethacrylate, 3-(triallylsilyl)propyl acrylate, 3-(triallylsilyl)propyl methacrylate, (triethoxysilyl) methyl methacrylate, etc.), (2) alkyl silanes (e.g., amyltrichlorosilane, butyltrichlorosilane, tert-butyldimethylchlorosilane [tert-butyldimethylsilylating Agent], butylchlorodimethylsilane, 1,2-bis(triethoxysilyl)ethane, butyltriethoxysilane, 1,6-bis(trichlorosilyl)hexane, 1,6-bis(triethoxysilyl)hexane, chlorotrimethylsilane, cyclohexyltrichlorosilane, chloro(decyl)dimethylsilane, chloro(dodecyl)dimethylsilane, cyclohexyltrimethoxysilane, chloro(hexyl)dimethylsilane, cyclopentyltrimethoxysilane, chlorocyclohexyldimethylsilane, chloro(ethyl)dimethylsilane [dimethylethylsilylating Agent], decyltrichlorosilane, dodecyltrichlorosilane, dodecyltriethoxysilane, dimethyloctadecylchlorosilane, chlorodimethylpropylsilane [dimethylpropylsilylating Agent], dimethylisopropylchlorosilane [dimethylisopropylsilylating Agent], dimethyl-n-octylchlorosilane, chlorodiethylisopropylsilane, dodecyltrimethoxysilane, decyltriethoxysilane, dichloro(methyl)propylsilane, dimethoxy(methyl)-n-octylsilane, ethyltrichlorosilane, triethoxyethylsilane, ethyltrimethoxysilane, trichlorohexylsilane, hexyltrimethoxysilane, hexyltriethoxysilane, hexadecyltrimethoxysilane, 1,1,1,3,5,5,5-heptamethyl-3-[(trimethylsilyl)oxy]trisiloxane, hexadecyltriethoxysilane, isobutyltrichlorosilane, trichloro(methyl)silane, triethoxymethylsilane, trimethoxy(methyl)silane, methoxy(dimethyl)octadecylsilane, trichlorooctadecylsilane, octadecyltriethoxysilane, n-octyltrichlorosilane, triethoxy-n-octylsilane, octadecyltrimethoxysilane, trichloro(propyl)silane, chlorotriethylsilane, triisopropylsilyl chloride, trimethoxy(propyl)silane, chloro(dimethyl)thexylsilane, thexyltrichlorosilane, triethoxy(propyl)silane, trimethoxy-n-octylsilane, trichloro(hexadecyl)silane, triethoxy(isobutyl)silane, trichlorooctadecylsilane, etc.), (3) aminoalkyl silanes (e.g., 3-aminopropyltriethoxysilane, 3-(2-aminoethylamino)propyltrimethoxysilane, 3-(2-aminoethylamino)propyldimethoxymethylsilane, 3-(2-aminoethylamino)propyltriethoxysilane, 3-aminopropyldimethoxymethylsilane, [3-(6-aminohexylamino)propyl]trimethoxysilane, bis[3-(trimethoxysilyl)propyl]amine, 3-aminopropyldiethoxymethylsilane, [3-(N,N-dimethylamino)propyl]trimethoxysilane, trimethoxy[3-(phenylamino)propyl]silane, 3-aminopropyltrimethoxysilane, trimethyl[3-(triethoxysilyl)propyl]ammonium chloride, trimethyl[3-(trimethoxysilyl)propyl]ammonium chloride (ca. 50% in Methanol), trimethoxy[3-(methylamino)propyl]silane, N-[3-(trimethoxysilyl)propyl]butan-1-amine, etc.), (4) aryl- or arylalkyl silanes (e.g., benzylchlorodimethylsilane, benzyltriethoxysilane, chlorodimethyl(3-phenylpropyl)silane, chlorodimethylphenylsilane, dimethoxymethylphenylsilane, diethoxy(methyl)phenylsilane, dichloro(methyl)(2-phenylethyl)silane, etc.), (5) fluoroalkyl- or fluoroaryl silanes (e.g., chlorodimethyl(3,3,4,4,5,5,6,6,7,7,8,8,8-tridecafluoro-n-octyl)silane, chlorodimethyl[3-(2,3,4,5,6-pentafluorophenyl)propyl]silane, chloro(3,3,4,4,5,5,6,6,7,7,8,8,9,9,10,10,10-heptadecafluorodecyl)dimethylsilane, dichloro(methyl)(3,3,3-trifluoropropyl)silane, dimethoxy(methyl)(3,3,3-trifluoropropyl)silane, pentafluorophenyldimethylchlorosilane [pentafluorophenyldimethylsilylating Agent], pentafluorophenylethoxydimethylsilane, triethoxy-1H,1H,2H,2H-tridecafluoro-n-octylsilane, trichloro(1H,1H,2H,2H-tridecafluoro-n-octyl)silane, trichloro(1H,1H,2H,2H-heptadecafluorodecyl)silane, trimethoxy(3,3,3-trifluoropropyl)silane, triethoxy(1H,1H,2H,2H-nonafluorohexyl)silane, triethoxy-1H,1H,2H,2H-heptadecafluorodecylsilane, trimethoxy(1H,1H,2H,2H-heptadecafluorodecyl)silane, trimethoxy(1H,1H,2H,2H-nonafluorohexyl)silane, trichloro[3-(pentafluorophenyl)propyl]silane, triethoxy(pentafluorophenyl)silane, triethoxy[5,5,6,6,7,7,7-heptafluoro-4,4-bis(trifluoromethyl)heptyl]silane, trimethoxy(pentafluorophenyl)silane, trichloro(3,3,3-trifluoropropyl)silane, trimethoxy(1H,1H,2H,2H-tridecafluoro-n-octyl)silane, etc.), (6) glycidyloxyalkyl silanes (e.g., diethoxy(3-glycidyloxypropyl)methylsilane, 3-glycidyloxypropyltrimethoxysilane, 3-glycidyloxypropyl(dimethoxy)methylsilane, [8-(glycidyloxy)-n-octyl]trimethoxysilane, triethoxy(3-glycidyloxypropyl)silane, etc.), (7) olefinyl silanes (e.g., allyltriethoxysilane, allylchlorodimethylsilane, allyltrimethoxysilane, [bicyclo[2.2.1]hept-5-en-2-yl]triethoxysilane (mixture of isomers), chlorodimethylvinylsilane, diethoxymethylvinylsilane, dimethoxymethylvinylsilane, 1,1,1,5,5,5-hexamethyl-3-[(trimethylsilyl)oxy]-3-vinyltrisiloxane, trichlorovinylsilane, triisopropoxy(vinyl)silane, vinyltrimethoxysilane, triethoxyvinylsilane, dimethylethoxyvinylsilane, vinyltris(2-methoxyethoxy)silane, etc.), (11-azidoundecyl)trimethoxysilane, (bromomethyl)chlorodimethylsilane, (11-bromoundecyl)trichlorosilane, chloro(chloromethyl)dimethylsilane, 3-trimethoxysilylpropyl chloride, 3-chloropropyltrichlorosilane, 3-chloropropyldimethoxymethylsilane, (3-cyanopropyl)dimethylchlorosilane, 2-cyanoethyltriethoxysilane, (chloromethyl)triethoxysilane, (chloromethyl)trimethoxysilane, (3-chloropropyl)diethoxy(methyl)silane, chloro(3-chloropropyl)dimethylsilane, 2-(3,4-epoxycyclohexyl)ethyltrimethoxysilane, tris[3-(trimethoxysilyl)propyl] isocyanurate, (3-iodopropyl)trimethoxysilane, (3-mercaptopropyl)trimethoxysilane, 3-mercaptopropyl(dimethoxy)methylsilane, (3-mercaptopropyl)triethoxysilane, 2-propynyl [3-(Triethoxysilyl)propyl]carbamate, 3-chloropropyltriethoxysilane, 1-[3-(trimethoxysilyl)propyl]urea, (3-isocyanatopropyl)trimethoxysilane, [(3-triethoxysilyl)propyl]succinic anhydride, 3-(trichlorosilyl)propyl 2-bromo-2-methylpropanoate, 3-(trimethoxysilyl)propyl 2-bromo-2-methylpropanoate, 3-(triethoxysilyl)propyl 2-bromo-2-methylpropanoate, 1-[3-(triethoxysilyl)propyl]urea, N-[2-(N-vinylbenzylamino)ethyl]-3-aminopropyltrimethoxysilane hydrochloride, trimethylsiloxysilicate, or combinations thereof. In some examples, the adhesion promoter comprises silica (or silane) and alkyl groups in its structure.

In some examples, the heat and/or acid resistant shielding component is selected due to ease of accessibility, low cost, and durability, and comprises at least one of: polystyrene (PS), polyethylene (PE) (low-density and high-density), polypropylene (PP), polyvinyl chloride (PVC), polyamide (nylon), polytetrafluoroethylene (Teflon), thermoplastic polyurethanes (TPU), polychlorotrifluoroethylene (PCTFE), phenol-formaldehyde resin, para-aramids (e.g., Kevlar®, Twaron®), polyethylene terephthalate, polychloroprene, meta-aramid polymers (Nomex®), polyacrylonitrile (PAN), co-polyamids, polyimides, aromatic polyesters, poly-p-phenylene-2,6-benzobisoxazole (PBO), copolymers of ethylene and chlorotrifluoroethylene (ECTFE) (e.g., Halar®), polyvinylidene fluoride (PVDF), chlorinated polyvinyl chloride (CPVC), polydicyclopentadiene (PDCPD), poly(1,3,4-oxadiazole), polyquinoxalines, polyquinolines, hexafluoroisopropylidene (HFIP)-containing polymers, hexafluoroisopropoxy (HFIP-O) group-containing polymers, cellulose acetate, cellulose acetate butyrate, or monomers thereof.

Selection of the heat and/or acid resistant shielding component may be a result of durability studies testing the component's response in high-heat and/or acid environments. For example, Fourier-transform infrared spectroscopy (FT-IR) may be used to determine the structural integrity of the component before and after exposure to high-heat and/or acid environments (i.e., any changes to the chemical composition). Contact angle measurements may be used to determine changes in surface wettability properties.

In some examples, the protective coating may be dissolved in an organic solvent, and then disposed on a cleaned glass substrate via spin coating, spray coating, screen printing, inkjet printing, slot die coating, draw-down coating, or dip coating. The organic solvent comprises at least one of: toluene, phenol, benzene, acetone, methyl ethyl ketone (MEK), methyl n-butyl ketone, hexane, ethanol, trichloroethylene, carbon tetrachloride, 2,5-hexanedione, formaldehyde, trichloroethylene, 1,1,1-trichloroethane, methyl chloride, and the like.

Thereafter, the protective coating is then solidified by solvent evaporation and/or thermal or other irradiation curing methods. Thickness of the protective coating before and after solidifying ranges in a thickness of 10 nm to 250 nm, or 10 nm to 100 nm, or 100 nm to 250 nm, or 50 nm to 100 nm, or 100 nm to 150 nm, or 150 nm to 200 nm, or 200 nm to 250 nm, or any value or range disclosed therein. In some examples, such as when the substrate is curved or three-dimensional (3D), spray coating may be used to generate single-side texturing for specific applications. Patterning the protective coating may also be achieved by conventional photolithographic processes (e.g., photoresist deposition, patterning, etch-through, and removal), electron-beam (e-beam) lithography, laser ablation, etc.

After deposition of the blanket protective coating 22a and optionally, the patterned protective coating 22b, the substrate 10 is subjected to etching steps 110, 120, 210, 220 that includes etching the initial primary surface 10b with a hydrofluoric (HF) acid-free etchant having a pH of about 7 or less, or 6 or less, or 5 or less, or 4 or less, or 3 or less, or 2 or less, or 1 or less, or any value or range disclosed therein (step 1a). In some examples, the etchant comprises at least one of hydrochloric acid (HCl), citric acid, iron (III) chloride hexahydrate, hydrofluoric acid (HF), acetic acid, sulfuric acid ($H_2SO_4$), nitric acid ($HNO_3$), or the like during steps 110, 120, 210, 220. In some examples, step 110, 120, 210, 220 may be conducted at an elevated temperature higher than ambient conditions, for example, in a range of 40° C. to 120° C., or 40° C. to 110° C., or 40° C. to 100° C., or 50°

C. to 100° C., or 50° C. to 90° C., or 60° C. to 90° C., under 100° C., or any value or range disclosed therein. In some examples, step 110, 120, 210, 220 may be conducted for a time in a range of 10 min to 10 hrs, 10 min to 5 hrs, 30 min to 5 hrs, 30 min to 3 hrs, 1 hr to 3 hrs, or any value or range disclosed therein. Suitable concentrations for hydrochloric acid etchants, according to some examples, range from about 0.5 wt. % to about 15 wt. %. Suitable concentrations for citric acid etchants, according to some examples, range from about 1 wt. % to about 30 wt. % (e.g., 20 wt. %). Suitable concentrations for iron (III) chloride hexahydrate etchants, according to some examples, range from about 0.01M to about 10M (e.g., 1M). In some examples, an additional removing step may optionally be conducted after etching steps 110, 120, 210, 220 to remove excess etchant and leached substrate constituents from the etching steps 110, 120, 210, 220.

Specifically, the completion of etching steps 110, 210 results in an interim textured glass article having a textured region 20a and a leached layer 14 with a plateaued top surface 16. A leach layer may be formed due to differential etching of glass in acid. Non-silica glass components typically dissolve faster than $SiO_2$ in acid, leading to the formation of a leach layer (e.g., a porous structure). Portions of the substrate 10 not covered by the patterned protective coating 22b or blanket protective coating 22a include the leached layer 14 with the plateaued top surface 16. Moreover, further differential leaching and surface dissolution using the etchant of steps 110, 210 in steps 120, 220 leads to a transformed textured region 20a including includes a plurality of exposed features with an average feature size 18a and an average roughness 16a. According to some implementations, the exposed features of the textured region 20a, including their average feature size 18a and average roughness 16a, are configured to reduce the level of glare associated with article when it is employed in display devices. The average feature size 18a is given by an average of the maximum dimension of a sampling of features associated with the textured region 20a, measured according to analytical techniques described above. By steps 110, 120, 210, 220, the non-silica moieties of the glass leach out, leaving a porous leached layer 14a on the unprotected glass surface consisting of only silica. The region covered by the protective coating remains intact and include the non-silica moieties of the glass.

In some examples, at least some of the plurality of features have a peak and a valley. The "maximum dimension" of the exposed features is the greatest distance from one portion of a peak of a feature to another portion of the peak of the feature. The average feature size 18a associated with the textured region 20a is less than about 10 µm, or less than about 5 µm, or less than about 1 µm, or less than about 0.5 µm, or any value or range disclosed therein. In some examples, the average feature size 18a associated with the textured region 20a is less than about 10 µm, or less than about 9 µm, or less than about 8 µm, or less than about 7 µm, or less than about 6 µm, or less than about 5 µm, or less than about 4 µm, or less than about 3 µm, or less than about 2 µm, or less than about 1 µm, or less than about 0.9 µm, or less than about 0.8 µm, or less than about 0.7 µm, or less than about 0.6 µm, or less than about 0.5 µm, or less than about 0.4 µm, or less than about 0.3 µm, or less than about 0.2 µm, or less than about 0.1 µm, or any value or range disclosed therein.

In some examples, the average roughness 16a associated with the textured region 20a is in a range of 1 nm to 1000 nm, or 5 nm to 750 nm, or 10 nm to 500 nm, or 25 nm to 250 nm, or 50 nm to 100 nm, or 10 nm to 250 nm, or 10 nm to 100 nm, or 500 nm to 1000 nm, or 500 nm to 750 nm, or 250 nm to 750 nm, or 250 nm to 500 nm, or any value or range disclosed therein.

Once the acid treatment of steps 110, 120, 210, 220 are complete, the protective coating 22a and 22b is removed by rinsing in water. The leached layer 14a and any protective coating residue is removed in step 130, 230 by submerging the glass in a basic solution at moderate temperatures for a time ranging from 30 sec to 30 min, or from 1 min to 20 min, or from 5 min to 15 min (e.g., 10 min), or any value or range disclosed therein. In some examples, step 130, 230 is conducted with an etchant having a pH of about 10.0 or greater to form a textured region 20b. For example, the etchant of step 130, 230 may be an aqueous, alkaline solution having a pH ranging from about 10 to about 13. In particular, the leached layer 14a is removed during the treating step 130, 230, leaving the textured region 20b, which is defined by a plurality of features with an average feature size 18b and an average roughness 16b. The basic etchant used in step 130, 230 may penetrate pores and channels formed in the leached layer 14a, etching the glass slightly faster in those regions than denser regions of the glass, creating the peaks and valleys that make up the texture on the glass. Once etching is complete, the glass may be rinsed with deionized water and stored for later processing.

As described above, this plurality of features are initially formed during glass leaching step 110, 210, differential leaching and surface dissolution step 120, 220, and later 'revealed' by removal of leached layer 14a during water rinse/base wash step 130. In some examples, the physical attributes of the average feature size 18b and average roughness 16b may be substantially equivalent to the average feature size 18a and average roughness 16a, respectively. The composition of the textured region 20b is substantially equivalent to the bulk composition of the glass substrate 10, particularly with regard to silica.

EXAMPLES

The following examples describe various features and advantages provided by the disclosure and are in no way intended to limit the invention and appended claims.

Example 1

Six samples of glass A (63.64 mol. % $SiO_2$, 2.34 mol. % $B_2O_3$, 15.07 mol. % $Al_2O_3$, 9.27 mol. % $Na_2O$, 5.93 mol. % $Li_2O$, 1.17 mol. % ZnO, 0.045 mol. % $SnO_2$, 2.53 mol. % $P_2O_5$) (five coated on one side with trimethylsiloxysilicate adhesion promoter-polystyrene heat and/or acid resistant shielding component containing protective coating (e.g., FIG. 3B), and one not coated on either side), are etched in a 1 L solution of 20 wt. % citric acid and 1M $FeCl_3.6H_2O$ at 100° C. for 125 min. After leaching, the glass is rinsed with DI water, followed by a 10 min detergent (4 wt. % Semi-clean) wash at 60° C., then a 5 min 10 wt. % NaOH wash at 95° C., and finally, another 5 min rinse in DI water. The detergent and/or base rinse removes excess etchant and leached substrate constituents.

Figure 4:
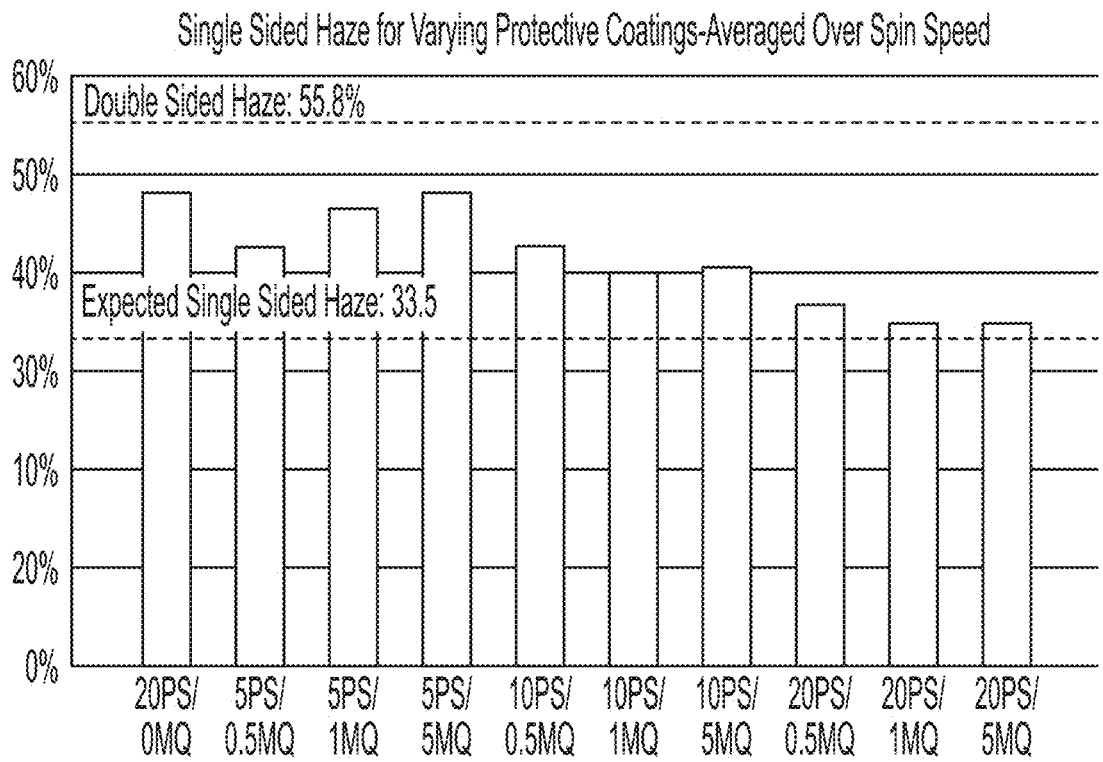
FIG. 4 illustrates the single-sided haze for protective coatings having various polystyrene-to-trimethylsiloxysilicate ratios after etching with 20 wt. % citric acid and 1M $FeCl_3 \cdot 6H_2O$.

The heat and/or acid resistant shielding component (polystyrene) is varied from 5 wt. % to 20 wt. % and the adhesion promoter (trimethylsiloxysilicate) is varied from 0.5 wt. % to 5 wt. % such that various polystyrene-to-trimethylsiloxysilicate ratios are tested. For example, FIG. 4 illustrates the single-sided haze for protective coatings having various polystyrene (PS)-to-trimethylsiloxysilicate (MQ) ratios after etching with 20 wt. % citric acid and 1M $FeCl_3.6H_2O$ to determine the optimal coating chemistry needed to achieve an equivalent haze as a single-sided textured glass formed via mechanical polishing. As reference, double-sided haze is measured to be 55.8% when glass A was etched with 20 wt. % citric acid and 1M $FeCl_3.6H_2O$; the calculated, expected single-sided haze is 33.5%.

When the glass surface is fully protected on one side, the expected single-sided haze may be estimated based on a relationship with double-sided haze of Equation 1:

Double Sided Haze (%)=$2x-(x^2/100)$, where $x$ is the single sided haze value in %    Equation 1

Figure 5:
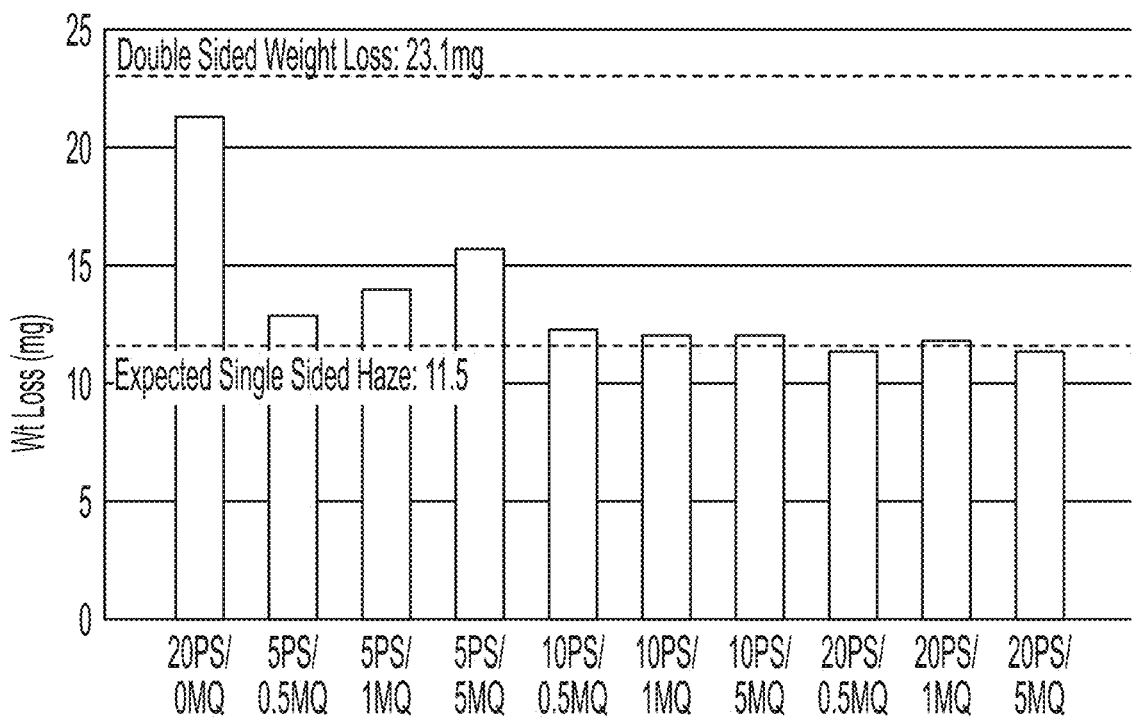
FIG. 5 illustrates a comparison of the glass weight loss for double-sided and single-sided textured glass having various polystyrene-to-trimethylsiloxysilicate ratios after etching with 20 wt. % citric acid and 1M $FeCl_3 \cdot 6H_2O$.

FIG. 5 illustrates a comparison of the glass weight loss for double-sided and single-sided textured glass having various polystyrene-to-trimethylsiloxysilicate ratios after etching with 20 wt. % citric acid and 1M $FeCl_3.6H_2O$. The weight loss from single-sided texturing is almost half of the value of the double-sided texturing because the surface area is reduced by almost half when the glass is protected on one side. When the polystyrene (PS)-to-trimethylsiloxysilicate (MQ) ratio is 20:1, the single-sided haze and the double-sided haze for the glasses etched in the same batch are close to Equation 1, and the weight loss of the single-sided textured glass is close to half of the double-sided texture glasses. Thus, based on the desired haze values of FIG. 4 and the expected weight loss of FIG. 5, the polystyrene-to-trimethylsiloxysilicate ratio of 20:1 is one preferred condition of the protective coating.

The ratio of 20:1 of polystyrene-to-trimethylsiloxysilicate for the protective coating allows for the textured glass to have a haze and weight loss in line with expected single-sided weight loss and haze values. The ratio of 20:5 of polystyrene-to-trimethylsiloxysilicate also shows promise, having a low haze and weight loss in line with single-side expected values. Other compositions exhibited lower haze than the double-sided control, but not sufficiently low to be in line with expected single-sided haze, even though most weight losses were similar to the expected single-side weight loss. Other compositions having higher polystyrene content or trimethylsiloxysilicate which are in line with expected single-sided weight loss and haze values are also contemplated as being within the scope of this disclosure.

Example 2

Four samples of glass A (three coated on one side with trimethylsiloxysilicate adhesion promoter-polystyrene heat and/or acid resistant shielding component containing protective coating and one not coated on either side), are etched in a 1 L solution of 20 wt. % citric acid and 1M $FeCl_3.6H_2O$ at 100° C. for 125 min. After leaching, the glass is rinsed with DI water, followed by a 10 min detergent (4 wt. % Semi-clean) wash at 60° C., then a 5 min 10 wt. % NaOH wash at 95° C., and finally, another 5 min rinse in DI water.

Figure 6:
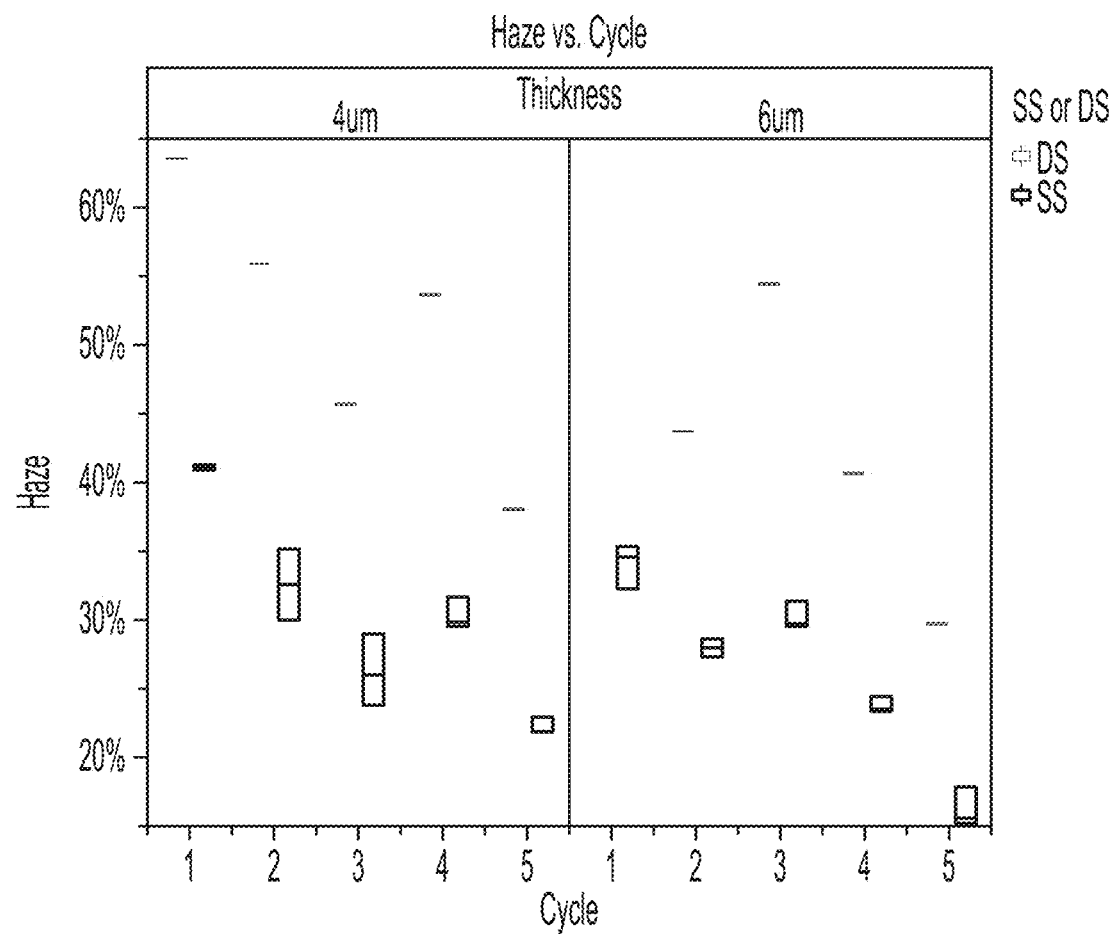
FIG. 6 illustrates single-side (SS) haze for glasses with coating protection and double-side (DS) haze for non-protected glasses.

Haze values were measured and recorded as "cycle 1." Thereafter, the above leach (using the citric acid/$FeCl_3.6H_2O$ mixture) and base wash (using NaOH) steps were repeated using another four samples of glass A in the same leaching and base wash solutions as was used in cycle 1 (or, the previous cycle). This process was repeated five times to collect data for five cycles. Due to a difference of dissolved glass in each cycle, different initial haze values are achieved from different cycles. FIG. 6 illustrates that single-side (SS) haze for the glass with coating protection changes synchronously (i.e., single-side haze trends with double-sided haze over increasing bath cycles) with double-side (DS) haze for the non-protected glasses in the same batches regardless of haze level. In other words, as the leached constituents accumulated in the citric acid/$FeCl_3.6H_2O$ solution mixture and the base wash solution and the protective coating accumulated in the base wash solution, the SS haze for glasses with coating protection changes synchronously with DS haze for non-protected glasses in the same batches, regardless of haze level.

Example 3

Figures 7A, 7B:
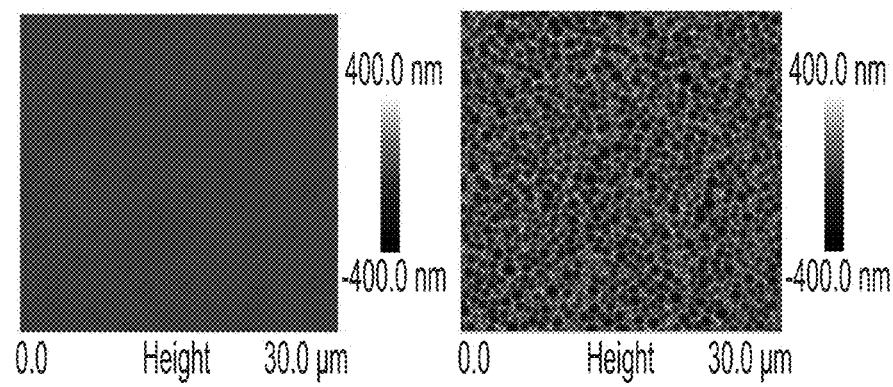
FIG. 7A is an atomic force microscopy (AFM) image of protected surfaces of glass A after etching by non-HF processes.
FIG. 7B is an AFM image of unprotected surfaces of glass A after etching by non-HF processes.
Figure 8A:
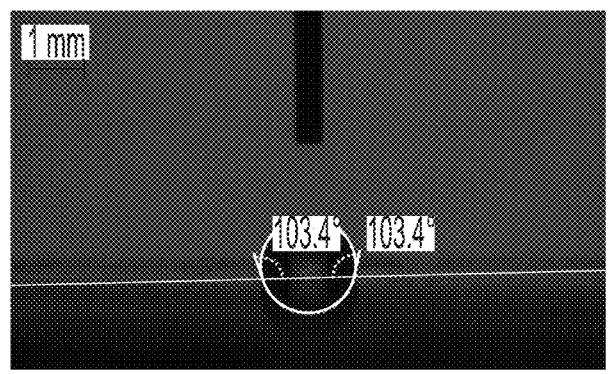
FIG. 8A the contact angle of a coated surface before wet etching processes.
Figure 8B:
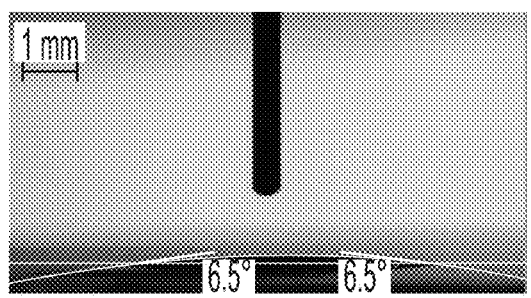
FIG. 8B the contact angle of a coated surface after wet etching processes.

Glass A is coated on one side with trimethylsiloxysilicate adhesion promoter-polystyrene heat and/or acid resistant shielding component containing protective coating and etched in a 1 L solution of 20 wt. % citric acid and 1M $FeCl_3.6H_2O$ at 100° C. for 125 min. After leaching, the glass is rinsed with DI water, followed by a 10 min detergent (4 wt. % Semi-clean) wash at 60° C., then a 5 min 10 wt. % NaOH wash at 95° C., and finally, another 5 min rinse in DI water. Atomic force microscopy (AFM, as measured by a Veeco/Brucker Bioscope Catalyst and Bruker Dimension FastScan apparatus) (FIGS. 7A and 7B) and water contact angle (as measured by a Krüss DSA100 Sliding Angle Goniometer apparatus) (FIGS. 8A and 8B) measurements were conducted to examine the difference on the coated side and non-coated side after etching. Turning to FIGS. 7A and 7B, AFM results indicate that after etching, the surface roughness ($R_a$) on a coated (i.e., protected) side is 2.6 nm while the surface roughness on a non-protected side is 90 nm. Contact angle results from FIGS. 8A and 8B indicate that prior to etching, a contact angle of the coating is approximately 1310 and that after etching (step 130, 230—base wash), the contact angle decreases to 6.5°, indicating a complete removal of the coating from the glass surface. As a control, the contact angle of non-treated glass A is 13.7°.

Example 4

Figure 9:
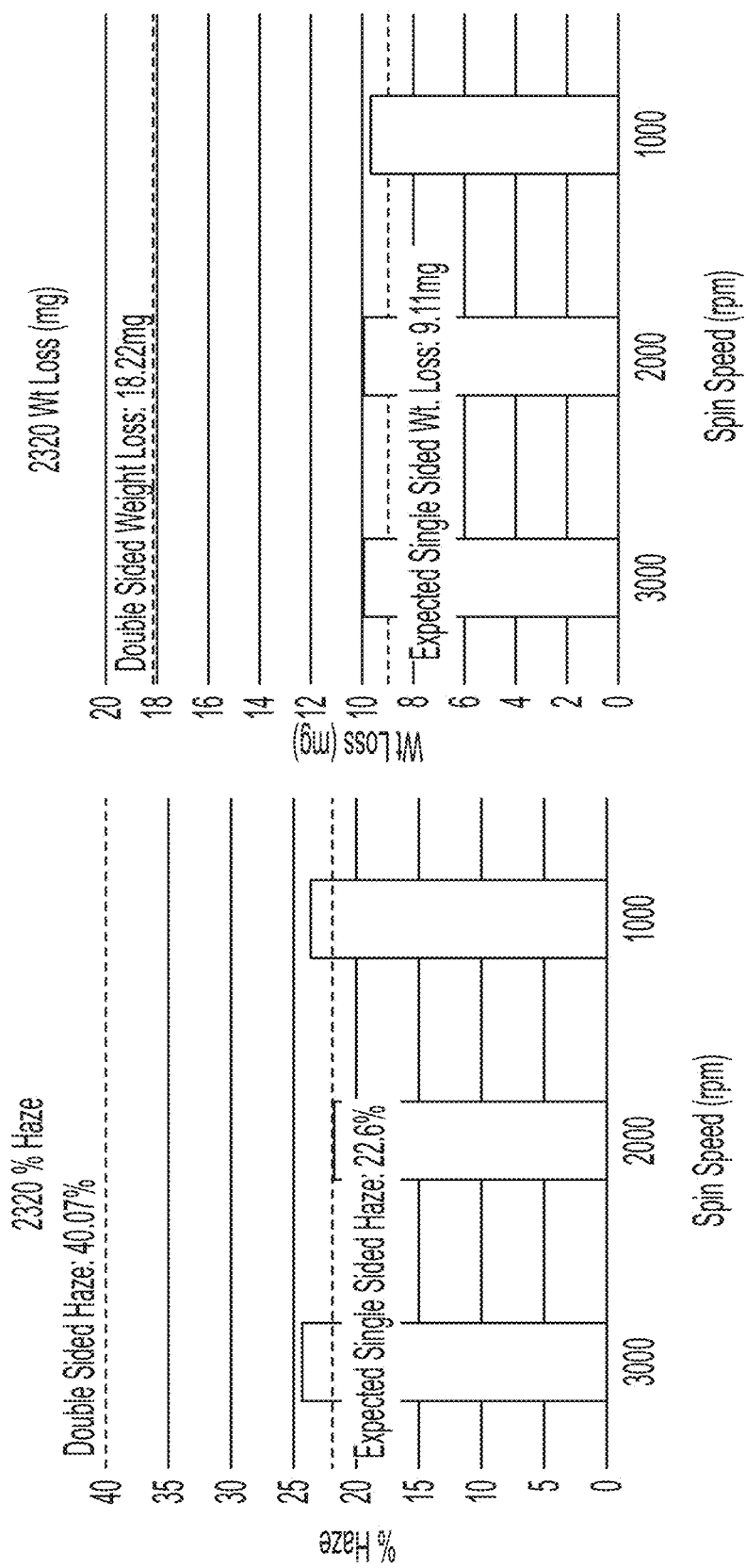
FIG. 9 illustrates a comparison of glass % haze (left) and weight loss (right) for double-sided and single-sided textured glasses at varying spin speeds (coating thicknesses) after etching with 10 wt. % HCl and 1M $FeCl_3 \cdot 6H_2O$.

Glass B (67.37 mol. % $SiO_2$, 3.67 mol. % $B_2O_3$, 12.73 mol. % $Al_2O_3$, 13.77 mol. % $Na_2O$, 0.01 mol. % $K_2O$, 2.39 mol. % MgO, 0.003 mol. % $TiO_2$, 0.01 mol. % $Fe_2O_3$, 0.01 mol. % $ZrO_2$, and 0.09 mol. % $SnO_2$) is coated on one side with trimethylsiloxysilicate adhesion promoter-polystyrene heat and/or acid resistant shielding component containing protective coating and etched in a 1 L solution of 10 wt. % HCl and 1M $FeCl_3.6H_2O$ at 100° C. for 150 min. After leaching, the glass is rinsed with DI water, followed by a 10 min detergent (4 wt. % Semi-clean) wash at 60° C., and finally, another 5 min rinse in DI water. FIG. 9 illustrates a comparison of glass % haze (left) and weight loss (right) for double-sided and single-sided textured glasses at varying spin speeds (coating thicknesses) after etching with 10 wt. % HCl and 1M $FeCl_3.6H_2O$. As seen in FIG. 9, both % haze and weight loss of the coated samples match closely with expected single-sided values. As reference, double-sided weight loss is measured to be 18.22 mg when glass B is etched in the same condition, and the calculated, expected single-sided weight loss is 9.11 mg. Similarly, a reference double-sided haze value is 40.07%, and the calculated, expected single-sided haze is 22.6%.

Double-sided weight loss/haze is measured, and the expected calculated single-side haze/weight loss is calculated from their respective measured double-sided values as explained above. Single-side values are calculated from double-side values of the control sample which was double-sided etched in order to compare single-side haze/weight loss measured from the sample that uses the protective coating on one side with the expected/calculated single-side values.

Example 5

Figure 10:
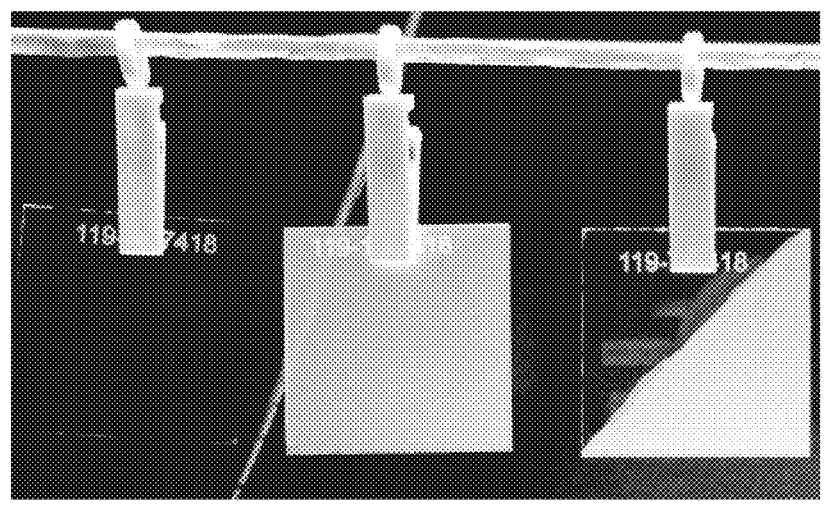
FIG. 10 illustrates an image of sample A (left), sample B (middle), and sample C (right) after etching in 20 wt. % citric acid and 1M $FeCl_3 \cdot 6H_2O$ 125 min.

Glass A is coated with trimethylsiloxysilicate adhesion promoter-polystyrene heat and/or acid resistant shielding component containing protective coating in various patterns. For example, a first sample was completely coated on both sides (sample A), a second sample not coated at all (sample B), and a third sample was partially (e.g., halfway) coated on both sides (sample C). Thereafter, samples A-C were etched in a 1 L solution of 20 wt. % citric acid and 1M $FeCl_3 \cdot 6H_2O$ at 100° C. for 125 min. FIG. 10 illustrates an image of sample A (left), sample B (middle), and sample C (right) after etching in 20 wt. % citric acid and 1M $FeCl_3 \cdot 6H_2O$ 125 min. After leaching, samples A-C were rinsed with DI water, followed by a 10 min detergent (4 wt. % Semi-clean) wash at 60° C., then a 5 min DI water rinse.

From FIG. 10, it is shown that the protective coating may be used to make patterns for full protection. Sample A (completely coated on both sides) has no developed haze, as it appears like clear non-etched glass. Sample B (not coated at all) is etched on both sides. Sample C (partially coated on both sides) is masked in a diagonal triangle pattern on both sides to make a triangle design.

Figure 11A:
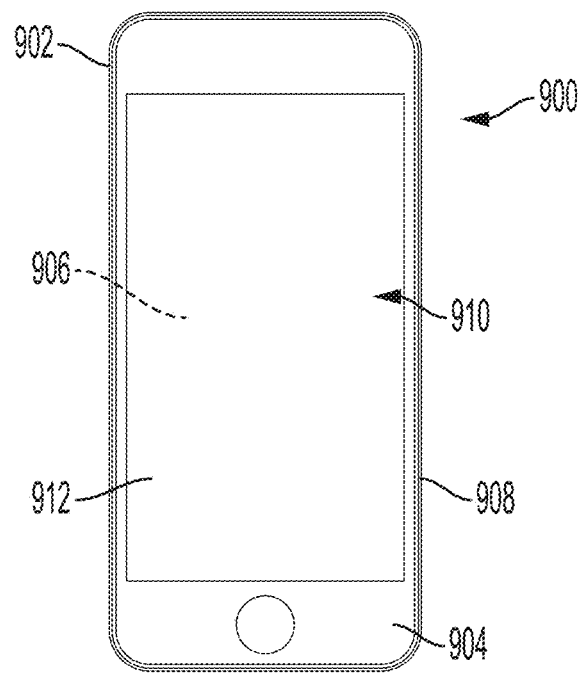
FIG. 11A is a plane view of an exemplary electronic device incorporating any of the articles disclosed herein.
Figure 11B:
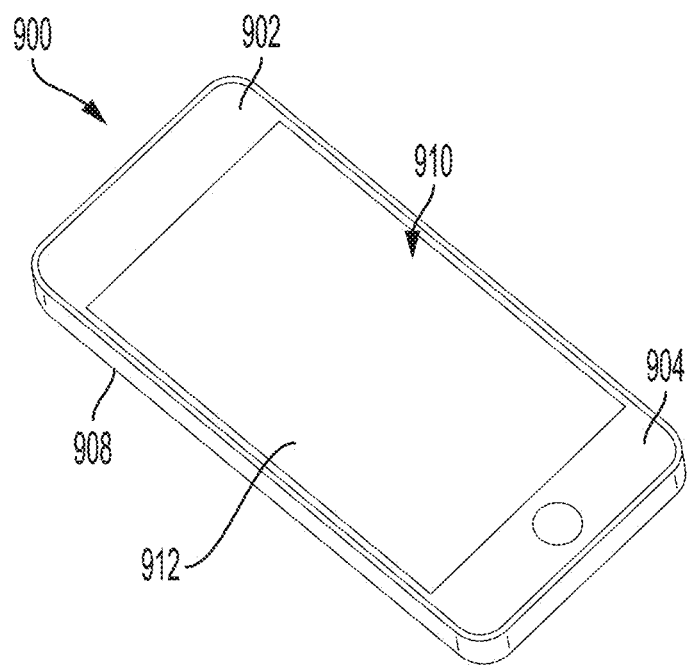
FIG. 11B is a perspective view of the exemplary electronic device of FIG. 11A.

The glass articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the glass articles disclosed herein, including glass articles 100a, 100b, is shown in FIGS. 11A and 11B. Specifically, FIGS. 11A and 11B show a consumer electronic device 900 including a housing 902 having front 904, back 906, and side surfaces 908; electrical components (not shown) that are at least partially inside or entirely within the housing and including at least a controller, a memory, and a display 910 at or adjacent to the front surface of the housing; and a cover substrate 912 at or over the front surface of the housing such that it is over the display. In some embodiments, at least one of the cover substrate 912 or a portion of housing 902 may include any of the glass articles disclosed herein.

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. A method of making a textured glass article, comprising:
    providing a glass substrate having an initial primary surface and an opposing primary surface;
    disposing a protective coating on at least one of the initial primary surface or the opposing primary surface, wherein the protective coating comprises a blend of an adhesion promoting component and a heat and/or acid resistant shielding component; and
    etching the glass substrate with a hydrofluoric acid-free etchant having a pH of about 7 or less to form a leached layer in the glass substrate.

2. The method according to claim 1, wherein the step of disposing comprises:
    depositing a patterned protective coating on the initial primary surface.

3. The method according to claim 2, wherein the step of disposing further comprises:
    depositing a blanket protective coating on the opposing primary surface.

4. The method according to claim 1, wherein the adhesion promoting component comprises at least one of: acryloyloxyalkyl silanes, alkyl silanes, aminoalkyl silanes, aryl silanes, arylalkyl silanes, fluoroalkyl silanes, fluoroaryl silanes, glycidyloxyalkyl silanes, olefinyl silanes, or combinations thereof.

5. The method according to claim 4, wherein:
    the acryloyloxyalkyl silanes are selected from the group consisting of: 3-(trimethoxysilyl)propyl acrylate, 3-(chlorodimethylsilyl)propyl methacrylate, 3-[diethoxy(methyl)silyl]propyl methacrylate, 3-[dimethoxy(methyl)silyl]propyl acrylate, 3-(trimethoxysilyl)propyl methacrylate, 3-[tris(trimethylsilyloxy)silyl]propyl methacrylate, 3-[dimethoxy(methyl)silyl]propyl methacrylate, 3-(methoxydimethylsilyl)propyl acrylate, 3-(triethoxysilyl)propyl methacrylate, 3-(triallylsilyl)propyl acrylate, 3-(triallylsilyl)propyl methacrylate, (triethoxysilyl)methyl methacrylate;
    the alkyl silanes are selected from the group consisting of: amyltrichlorosilane, butyltrichlorosilane, tert-butyldimethylchlorosilane [tert-butyldimethylsilylating Agent], butylchlorodimethylsilane, 1,2-bis(triethoxysilyl)ethane, butyltriethoxysilane, 1,6-bis(trichlorosilyl)hexane, 1,6-bis(triethoxysilyl)hexane, chlorotrimethylsilane, cyclohexyltrichlorosilane, chloro(decyl)dimethylsilane, chloro(dodecyl)dimethylsilane, cyclohexyltrimethoxysilane, chloro(hexyl)dimethylsilane, cyclopentyltrimethoxysilane, chlorocyclohexyldimethylsilane, chloro(ethyl)dimethylsilane [dimethylethylsilylating Agent], decyltrichlorosilane, dodecyltrichlorosilane, dodecyltriethoxysilane, dimethyloctadecylchlorosilane, chlorodimethylpropylsilane [dimethylpropylsilylating Agent], dimethylisopropylchlorosilane [dimethylisopropylsilylating Agent], dimethyl-n-octylchlorosilane, chlorodiethylisopropylsilane, dodecyltrimethoxysilane, decyltriethoxysilane, dichloro(methyl)propylsilane, dimethoxy(methyl)-n-octylsilane, ethyltrichlorosilane, triethoxyethylsilane, ethyltrimethoxysilane, trichlorohexylsilane, hexyltrimethoxysilane, hexyltriethoxysilane, hexadecyltrimethoxysilane, 1,1,1,3,5,5,5-heptamethyl-3-[(trimethylsilyl)oxy]trisiloxane, hexadecyltriethoxysilane, isobutyltrichlorosilane, trichloro(methyl)silane, triethoxymethylsilane, trimethoxy(methyl)silane, methoxy(dimethyl)octadecylsilane, trichlorooctadecylsilane, octadecyltriethoxysilane, n-octyltrichlorosilane, triethoxy-n-octylsilane, octadecyltrimethoxysilane, trichloro(propyl)silane, chlorotriethylsilane, triisopropylsilyl chloride, trimethoxy(propyl)silane, chloro(dimethyl)thexylsilane, thexyltrichlorosilane, triethoxy(propyl)silane, trimethoxy-n-octylsilane, trichloro(hexadecyl)silane, triethoxy(isobutyl)silane, trichlorooctadecylsilane;
    the aminoalkyl silanes are selected from the group consisting of: 3-aminopropyltriethoxysilane, 3-(2-aminoethylamino)propyltrimethoxysilane, 3-(2-aminoethylamino)propyldimethoxymethylsilane, 3-(2-aminoethylamino)propyltriethoxysilane, 3-aminopropyldimethoxymethylsilane, [3-(6-aminohexylamino)propyl]trimethoxysilane, bis[3-(trimethoxysilyl)propyl]amine, 3-aminopropyldiethoxymethylsilane, [3-(N,N-dimethylamino)propyl]trimethoxysilane, trimethoxy[3-(phenylamino)propyl]silane, 3-aminopropyltrimethoxysilane, trimethyl[3-(triethoxysilyl)propyl]ammonium chloride, trimethyl[3-(trimethoxysilyl)propyl]ammonium chloride (ca. 50% in Methanol), trimethoxy[3-(methylamino)propyl]silane, N-[3-(trimethoxysilyl)propyl]butan-1-amine;

the aryl silanes and arylalkyl silanes are selected from the group consisting of: benzylchlorodimethylsilane, benzyltriethoxysilane, chlorodimethyl(3-phenylpropyl)silane, chlorodimethylphenylsilane, dimethoxymethylphenylsilane, diethoxy(methyl)phenylsilane, dichloro(methyl)(2-phenylethyl)silane;

the fluoroalkyl silanes and fluoroaryl silanes are selected from the group consisting of: chlorodimethyl(3,3,4,4,5,5,6,6,7,7,8,8,8-tridecafluoro-n-octyl)silane, chlorodimethyl[3-(2,3,4,5,6-pentafluorophenyl)propyl]silane, chloro(3,3,4,4,5,5,6,6,7,7,8,8,9,9,10,10,10-heptadecafluorodecyl)dimethylsilane, dichloro(methyl)(3,3,3-trifluoropropyl)silane, dimethoxy(methyl)(3,3,3-trifluoropropyl)silane, pentafluorophenyldimethylchlorosilane [pentafluorophenyldimethylsilylating Agent], pentafluorophenylethoxydimethylsilane, triethoxy-1H,1H,2H,2H-tridecafluoro-n-octylsilane, trichloro(1H,1H,2H,2H-tridecafluoro-n-octyl)silane, trichloro(1H,1H,2H,2H-heptadecafluorodecyl)silane, trimethoxy(3,3,3-trifluoropropyl)silane, triethoxy(1H,1H,2H,2H-nonafluorohexyl)silane, triethoxy-1H,1H,2H,2H-heptadecafluorodecylsilane, trimethoxy(1H,1H,2H,2H-heptadecafluorodecyl)silane, trimethoxy(1H,1H,2H,2H-nonafluorohexyl)silane, trichloro[3-(pentafluorophenyl)propyl]silane, triethoxy(pentafluorophenyl)silane, triethoxy[5,5,6,6,7,7,7-heptafluoro-4,4-bis(trifluoromethyl)heptyl]silane, trimethoxy(pentafluorophenyl)silane, trichloro(3,3,3-trifluoropropyl)silane, trimethoxy(1H,1H,2H,2H-tridecafluoro-n-octyl)silane;

the glycidyloxyalkyl silanes are selected from the group consisting of: diethoxy(3-glycidyloxypropyl)methylsilane, 3-glycidyloxypropyltrimethoxysilane, 3-glycidyloxypropyl(dimethoxy)methylsilane, [8-(glycidyloxy)-n-octyl]trimethoxysilane, triethoxy(3-glycidyloxypropyl)silane; and the olefinyl silanes are selected from the group consisting of: allyltriethoxysilane, allylchlorodimethylsilane, allyltrimethoxysilane, [bicyclo[2.2.1]hept-5-en-2-yl]triethoxysilane (mixture of isomers), chlorodimethylvinylsilane, diethoxymethylvinylsilane, dimethoxymethylvinylsilane, 1,1,1,5,5,5-hexamethyl-3-[(trimethylsilyl)oxy]-3-vinyltrisiloxane, trichlorovinylsilane, triisopropoxy(vinyl)silane, vinyltrimethoxysilane, triethoxyvinylsilane, dimethylethoxyvinylsilane, vinyltris(2-methoxyethoxy)silane, etc.), (11-azidoundecyl)trimethoxysilane, (bromomethyl)chlorodimethylsilane, (11-bromoundecyl)trichlorosilane, chloro(chloromethyl)dimethylsilane, 3-trimethoxysilylpropyl chloride, 3-chloropropyltrichlorosilane, 3-chloropropyldimethoxymethylsilane, (3-cyanopropyl)dimethylchlorosilane, 2-cyanoethyltriethoxysilane, (chloromethyl)triethoxysilane, (chloromethyl)trimethoxysilane, (3-chloropropyl)diethoxy(methyl)silane, chloro(3-chloropropyl)dimethylsilane, 2-(3,4-epoxycyclohexyl) ethyltrimethoxysilane, tris[3-(trimethoxysilyl)propyl]isocyanurate, (3-iodopropyl)trimethoxysilane, (3-mercaptopropyl)trimethoxysilane, 3-mercaptopropyl(dimethoxy)methylsilane, (3-mercaptopropyl)triethoxysilane, 2-propynyl [3-(Triethoxysilyl)propyl]carbamate, 3-chloropropyltriethoxysilane, 1-[3-(trimethoxysilyl)propyl]urea, (3-isocyanatopropyl)trimethoxysilane, [(3-triethoxysilyl)propyl]succinic anhydride, 3-(trichlorosilyl)propyl 2-bromo-2-methylpropanoate, 3-(trimethoxysilyl)propyl 2-bromo-2-methylpropanoate, 3-(triethoxysilyl)propyl 2-bromo-2-methylpropanoate, 1-[3-(triethoxysilyl)propyl]urea, N-[2-(N-vinylbenzylamino)ethyl]-3-aminopropyltrimethoxysilane hydrochloride, trimethylsiloxysilicate.

6. The method according to claim 1, wherein the heat and/or acid resistant shielding component comprises at least one of: polystyrene (PS), polyethylene (PE), polypropylene (PP), polyvinyl chloride (PVC), polyamide, polytetrafluoroethylene, thermoplastic polyurethanes (TPU), polychlorotrifluoroethylene (PCTFE), phenol-formaldehyde resin, para-aramids, polyethylene terephthalate, polychloroprene, meta-aramid polymers, polyacrylonitrile (PAN), co-polyamids, polyimides, aromatic polyesters, poly-p-phenylene-2,6-benzobisoxazole (PBO), copolymers of ethylene and chlorotrifluoroethylene (ECTFE), polyvinylidene fluoride (PVDF), chlorinated polyvinyl chloride (CPVC), polydicyclopentadiene (PDCPD), poly(1,3,4-oxadiazole), polyquinoxalines, polyquinolines, hexafluoroisopropylidene (HFIP)-containing polymers, hexafluoroisopropoxy (HFIP-0) group-containing polymers, cellulose acetate, cellulose acetate butyrate, or monomers thereof.

7. A method of making a textured glass article, comprising:
providing a glass substrate having an initial primary surface and an opposing primary surface;
disposing a protective coating on at least one of the initial primary surface or the opposing primary surface;
etching the glass substrate with a hydrofluoric acid-free etchant having a pH of about 7 or less to form a leached layer in the glass substrate; and
wherein the step of disposing comprises:
dissolving an adhesion promoting component and a heat and/or acid resistant shielding component in an organic solvent to form a blend;
disposing the blend on the at least one of the initial primary surface or the opposing primary surface via at least one of: spin coating, spray coating, screen printing, inkjet printing, slot die coating, draw-down coating, or dip coating to form the protective coating; and
curing the protective coating by solvent evaporation, thermal curing, or irradiation.

8. The method of claim 1, wherein the step of etching comprises:
etching the glass substrate with an etchant comprising at least one of hydrochloric acid (HCl), citric acid, iron (III) chloride hexahydrate, hydrofluoric acid (HF), acetic acid, sulfuric acid ($H_2SO_4$), or nitric acid ($HNO_3$) at a temperature in a range of 40° C. to 120° C. for a time in a range of 30 min to 3 hrs.

9. The method according to claim 8, wherein the step of etching further comprises:
removing excess etchant and leached substrate constituents.

10. The method according to claim 1, wherein the step of etching comprises:

a first etching step to form an interim textured glass substrate having a first leached layer with a plateaued top surface; and a second etching step to form a secondary textured glass substrate having a second leached layer with a plurality of exposed features, wherein the plurality of exposed features have a first average feature size and a first average roughness.

11. The method according to claim 10, wherein:

the plurality of exposed features comprise a plurality of peaks and valleys;

the first average feature size is a distance between adjacent peaks in a range of less than about 10 µm; and the first average roughness is a peak-to-valley distance in a range of 1 nm to 1000 nm.

12. The method according to claim 11, further comprising:

removing the protective coating and the second leached layer to form the textured glass article having a second average feature size and a second average roughness, wherein the second average feature size and the second average roughness is substantially equivalent to the first average feature size and the first average roughness.

13. The method according to claim 1, further comprising:

removing the protective coating and the leached layer to form the textured glass article having an average feature size and an average roughness.

14. The method according to claim 1, wherein the textured glass article comprises a sparkle of 2% or less.

15. A method of making a textured glass article, comprising:

providing a glass substrate having an initial primary surface and an opposing primary surface;

disposing a protective coating on at least one of the initial primary surface or the opposing primary surface, wherein the protective coating comprises a blend of an adhesion promoting component and a heat and/or acid resistant shielding component;

a first etching step to form an interim textured glass substrate having a first leached layer with a plateaued top surface; and a second etching step to form a secondary textured glass substrate having a second leached layer with a plurality of exposed features, wherein the plurality of exposed features have a first average feature size and a first average roughness.

16. The method according to claim 15, wherein:

the plurality of exposed features comprise a plurality of peaks and valleys;

the first average feature size is a distance between adjacent peaks in a range of less than about 10 µm; and the first average roughness is a peak-to-valley distance in a range of 1 nm to 1000 nm.

17. The method according to claim 15, further comprising:

removing the protective coating and the second leached layer to form the textured glass article having a second average feature size and a second average roughness, wherein the second average feature size and the second average roughness is substantially equivalent to the first average feature size and the first average roughness.

18. A consumer electronic product, comprising:

a housing having a front surface, a back surface and side surfaces;

electrical components provided at least partially within the housing, the electrical components including at least a controller, a memory, and a display, the display being provided at or adjacent the front surface of the housing; and a cover glass disposed over the display, wherein at least one of a portion of the housing or the cover glass is formed by the method of claim 16.

19. The method according to claim 15, wherein the adhesion promoting component comprises at least one of: acryloyloxyalkyl silanes, alkyl silanes, aminoalkyl silanes, aryl silanes, arylalkyl silanes, fluoroalkyl silanes, fluoroaryl silanes, glycidyloxyalkyl silanes, olefinyl silanes, or combinations thereof.

20. The method according to claim 15, wherein the heat and/or acid resistant shielding component comprises at least one of: polystyrene (PS), polyethylene (PE), polypropylene (PP), polyvinyl chloride (PVC), polyamide, polytetrafluoroethylene, thermoplastic polyurethanes (TPU), polychlorotrifluoroethylene (PCTFE), phenol-formaldehyde resin, para-aramids, polyethylene terephthalate, polychloroprene, meta-aramid polymers, polyacrylonitrile (PAN), co-polyamids, polyimides, aromatic polyesters, poly-p-phenylene-2,6-benzobisoxazole (PBO), copolymers of ethylene and chlorotrifluoroethylene (ECTFE), polyvinylidene fluoride (PVDF), chlorinated polyvinyl chloride (CPVC), polydicyclopentadiene (PDCPD), poly(1,3,4-oxadiazole), polyquinoxalines, polyquinolines, hexafluoroisopropylidene (HFIP)-containing polymers, hexafluoroisopropoxy (HFIP-O) group-containing polymers, cellulose acetate, cellulose acetate butyrate, or monomers thereof.

21. A consumer electronic product, comprising:

a housing having a front surface, a back surface and side surfaces;

electrical components provided at least partially within the housing, the electrical components including at least a controller, a memory, and a display, the display being provided at or adjacent the front surface of the housing; and a cover glass disposed over the display, wherein at least one of a portion of the housing or the cover glass is formed by the method of claim 1.

* * * * *

UNITED STATES PATENT AND TRADEMARK OFFICE
CERTIFICATE OF CORRECTION

| | |
|---|---|
| PATENT NO. | : 11,485,677 B2 |
| APPLICATION NO. | : 16/912601 |
| DATED | : November 1, 2022 |
| INVENTOR(S) | : Gilbert Alexander Castillo et al. |

It is certified that error appears in the above-identified patent and that said Letters Patent is hereby corrected as shown below:

In the Claims

In Column 28, Line 18, in Claim 18, delete "claim 16." and insert -- claim 15. --.

Signed and Sealed this
Twenty-ninth Day of August, 2023

Katherine Kelly Vidal
*Director of the United States Patent and Trademark Office*